United States Patent
Ueda et al.

(10) Patent No.: US 9,154,143 B2
(45) Date of Patent: Oct. 6, 2015

(54) SEMICONDUCTOR DEVICE

(75) Inventors: Keisuke Ueda, Kawasaki (JP); Toshiya Uozumi, Kawasaki (JP); Ryo Endo, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 55 days.

(21) Appl. No.: 13/982,249

(22) PCT Filed: Jan. 26, 2011

(86) PCT No.: PCT/JP2011/051458
§ 371 (c)(1),
(2), (4) Date: Jul. 26, 2013

(87) PCT Pub. No.: WO2012/101774
PCT Pub. Date: Aug. 2, 2012

(65) Prior Publication Data
US 2013/0300477 A1    Nov. 14, 2013

(51) Int. Cl.
*H03L 7/00* (2006.01)
*H03L 7/093* (2006.01)
(Continued)

(52) U.S. Cl.
CPC .............. *H03L 7/093* (2013.01); *H03L 7/099* (2013.01); *H03L 7/10* (2013.01); *H03L 7/1075* (2013.01);
(Continued)

(58) Field of Classification Search
CPC ............ H03L 7/00; H03L 7/07; H03L 7/099; H03L 7/0991; H03L 7/103; H03L 7/093
USPC ........ 327/156, 159; 331/1 A, 1 R, 15, 16, 25, 331/34, 36 C, 177 R, 177 V, 182, 185; 455/180.3, 180.4, 260, 262; 375/376
See application file for complete search history.

(56) References Cited

U.S. PATENT DOCUMENTS 6,546,060 B1   4/2003   Kawai
6,838,951 B1 * 1/2005   Nieri et al. ................. 331/177 V
(Continued)

FOREIGN PATENT DOCUMENTS

JP       3-196706 A    8/1991
JP    2002-118461 A    4/2002
(Continued)

OTHER PUBLICATIONS

Notice of Grounds of Rejection Japanese Patent Application No. 2012-554564 dated Sep. 2, 2014 with full Engish translation.
(Continued)

*Primary Examiner* — Arnold Kinkead
*Assistant Examiner* — Richard Tan
(74) *Attorney, Agent, or Firm* — McDermott Will & Emery LLP

(57) ABSTRACT

A semiconductor device includes a controlled oscillator and a control unit. The controlled oscillator includes a resonance circuit, an amplification unit, and a current adjustment unit. The resonance circuit includes one or a plurality of inductors and a first capacitive unit having a variable capacitance value. The amplification unit is connected to the resonance circuit, and outputs a local oscillation signal having an oscillation frequency corresponding to a resonance frequency of the resonance circuit. The current adjustment unit adjusts a value of a drive current to be supplied to the amplification unit. The control unit controls the capacitance value of the first capacitive unit and the current adjustment unit. When the control unit instructs the current adjustment unit to change the value of the drive current to be supplied to the amplification unit, the control unit also changes the capacitance value of the first capacitive unit.

5 Claims, 19 Drawing Sheets

(51) Int. Cl.
*H03L 7/107* (2006.01)
*H03L 7/099* (2006.01)
*H03L 7/07* (2006.01)
*H03L 7/10* (2006.01)
*H03L 7/18* (2006.01)

(52) U.S. Cl.
CPC ............... *H03L 7/07* (2013.01); *H03L 7/0991* (2013.01); *H03L 7/103* (2013.01); *H03L 7/105* (2013.01); *H03L 7/18* (2013.01); *H03L 2207/06* (2013.01); *H03L 2207/50* (2013.01)

(56) References Cited

U.S. PATENT DOCUMENTS

| | | | |
|---|---|---|---|
| 2004/0169564 A1* | 9/2004 | Muramatsu | 331/177 V |
| 2005/0218947 A1 | 10/2005 | Tanaka | |
| 2008/0278245 A1* | 11/2008 | Uozumi et al. | 331/17 |
| 2009/0111409 A1 | 4/2009 | Sun et al. | |
| 2009/0212876 A1 | 8/2009 | Kobayashi | |
| 2010/0308909 A1* | 12/2010 | Verma et al. | 330/131 |

FOREIGN PATENT DOCUMENTS

| | | |
|---|---|---|
| JP | 2002-314408 A | 10/2002 |
| JP | 2003-158452 A | 5/2003 |
| JP | 2005-109608 A | 4/2005 |
| JP | 2005-318509 A | 11/2005 |
| JP | 2007-074436 A | 3/2007 |
| JP | 2009-027581 A | 2/2009 |
| JP | 2009-182918 A | 8/2009 |
| JP | 2009-201016 A | 9/2009 |
| JP | 2011-502403 A | 1/2011 |
| WO | 2006/055792 A1 | 5/2006 |

OTHER PUBLICATIONS

Xu et al., "A 2.4-GHz low-power all-digital phase-locked loop", Custom Intergrated Circuits Conference (CICC), Sep. 13, 2009, IEEE, pp. 331-334.

Staszewski et al., All-Digital PLL and Transmitter for Mobile Phones, IEEE Jornal of Solid-State Circuits, vol. 40, No. 12, Dec. 2005, pp. 2469-2482.

Su et al., "Fractional-N Phase-Locked-Loop-Based Frequency Synthesis: A Tutorial", IEEE Transaction on Circuits and Systems-II: Express Briefs, vol. No. 12, Dec. 2009, pp. 881-885.

Haysmann et al., "A SAW-less CMOS TX for EGPRS and WCDMA", 2010 IEEE Radio Frequency Intergrated Circuits Symposium, May 2010, pp. 25-28.

"Battery Life Measurement Technique", [online], GSM Association Official Document DG.09 v5.1, Sep. 15, 2009, pp. 1-59.

International Search Report issued in International Applicaton No. PCT/JP2011/051458 mailed Apr. 26, 2011.

* cited by examiner

SEMICONDUCTOR DEVICE

RELATED APPLICATIONS

This application is the U.S. National Phase under 35 U.S.C. §371 of International Application No. PCT/JP2011/051458, filed on Jan. 26, 2011.

TECHNICAL FIELD

The present invention relates to a semiconductor device including a controlled oscillator mainly used in a phase locked loop.

BACKGROUND ART

An RFIC (Radio Frequency Integrated Circuit) for use in communications is mounted with a Phase Locked Loop (PLL) circuit required for modulation and demodulation. The PLL circuit is mainly composed of a controlled oscillator, a frequency divider, a phase comparator, and a filter. The PLL circuit is a circuit which keeps an oscillation frequency constant by controlling a control voltage (or a digital code) to be supplied to the controlled oscillator, using a feedback loop. Since the oscillation frequency can be changed by changing a frequency division ratio of the frequency divider, the PLL circuit with the above configuration is also called a frequency synthesizer.

Specific configurations of the PLL circuit are described in, for example, a paper written by Robert Bogdan Staszewski et al. ("All-Digital PLL and Transmitter for Mobile Phones", IEEE Journal of Solid-State Circuits, Vol. 40, No. 12, December 2005 (Non Patent Document 1)) and a paper written by Pin-En Su et al. ("Fractional-N Phase-Locked-Loop-Based Frequency Synthesis: A Tutorial", IEEE TRANSACTIONS ON CIRCUITS AND SYSTEMS, Vol. 56, No. 12, December 2009 (Non Patent Document 2)). The former document discloses an All Digital PLL (ADPLL) circuit, and the latter document discloses a Fractional-N PLL synthesizer. In the Fractional-N PLL synthesizer, an oscillation frequency can be continuously changed by equivalently setting a frequency division number to a non-integer, using $\Delta\Sigma$ modulation.

Of the components constituting the PLL circuit, the controlled oscillator is described in, for example, Japanese Patent Laying-Open No. 3-196706 (Patent Document 1) and Japanese Patent Laying-Open No. 2007-74436 (Patent Document 2). In an oscillation circuit described in Japanese Patent Laying-Open No. 3-196706 (Patent Document 1), at least one of capacitive units determining an oscillation frequency includes a plurality of capacitors connected in parallel. By selecting one or more capacitors from the plurality of capacitors, a capacitance value of the capacitive unit is controlled, and thereby the oscillation frequency is controlled.

Japanese Patent Laying-Open No. 2007-74436 (Patent Document 2) discloses a configuration of a voltage-controlled oscillation circuit for obtaining a wideband oscillation frequency. Specifically, the voltage-controlled oscillation circuit in this document includes: a plurality of switched capacitors each having a MOS (Metal Oxide Semiconductor) switch and a fixed capacitor connected in series, the MOS switch being turned ON/OFF by a first external control signal; a variable capacitor capable of making a capacitor value variable by a second external control signal; an inductor; and semiconductor current control elements constituting a differential pair.

In a PLL circuit, a state having a constant oscillation frequency is called a "locked state", and a state having an unstable oscillation frequency is called an "unlocked state". For an RFIC for use in mobile communications for mobile phones and the like, specifications have been established on the frequency at which a mounted PLL circuit enters a locked state, and on the period of time taken from when the PLL circuit is unlocked to when the PLL circuit is relocked, and values thereof should fall within the ranges of the specifications.

For example, a technique described in Japanese Patent Laying-Open No. 2002-314408 (Patent Document 3) is intended to keep an oscillation frequency within the range of the specifications, by preventing overlapping of an unwanted frequency component on a locked output signal in a PLL circuit employing a fractional frequency division system.

Techniques described in Japanese Patent Laying-Open No. 2002-118461 (Patent Document 4) and Japanese Patent Laying-Open No. 2003-158452 (Patent Document 5) are intended to achieve a faster lock-up time. Specifically, a faster lock-up time is achieved by increasing the amount of current to be supplied to a charge pump circuit.

A technique described in Japanese Patent Laying-Open No. 2005-109608 (Patent Document 6) is also intended to achieve a faster lock-up time. Specifically, a lock-up time is controlled by making a cut-off frequency of a loop filter variable.

In mobile communications in which a plurality of terminals are connected to one base station (for example, WCDMA: Wideband Code Division Multiple Access), it is necessary to keep electric power from each terminal received by the base station constant by adjusting transmission power of each terminal in accordance with a distance between the base station and each terminal, in order to increase the number of terminals that can communicate at one time. At each terminal, transmission power is controlled by adjusting a gain of an amplifier at an output unit of an RFIC (for example, Kurt Hausmann and six others, "A SAW-less CMOS TX for EGPRS and WCDMA", IEEE Radio Frequency Integrated Circuits Symposium, pp. 25 to 28, May 2010 (Non Patent Document 3)). As the distance between each terminal and the base station is decreased, power consumption in the RFIC is reduced (for a battery life measurement method, see, for example, GSM Association Official Document DG.09 v5.1 (Non Patent Document 4)).

CITATION LIST

Patent Document

PTD 1: Japanese Patent Laying-Open No. 3-196706
PTD 2: Japanese Patent Laying-Open No. 2007-74436
PTD 3: Japanese Patent Laying-Open No. 2002-314408
PTD 4: Japanese Patent Laying-Open No. 2002-118461
PTD 5: Japanese Patent Laying-Open No. 2003-158452
PTD 6: Japanese Patent Laying-Open No. 2005-109608

NON PATENT DOCUMENT

NPD 1: Robert Bogdan Staszewski and 14 others, "All-Digital PLL and Transmitter for Mobile Phones", IEEE Journal of Solid-State Circuits, Vol. 40, No. 12, December 2005
NPD 2: Pin-En Su et al. "Fractional-N Phase-Locked-Loop-Based Frequency Synthesis: A Tutorial", IEEE TRANSACTIONS ON CIRCUITS AND SYSTEMS, Vol. 56, No. 12, December 2009
NPD 3: Kurt Hausmann and six others, "A SAW-less CMOS TX for EGPRS and WCDMA", IEEE Radio Frequency Integrated Circuits Symposium, pp. 25 to 28, May 2010

NPD 4: "Battery Life Measurement Technique", [online], GSM Association Official Document DG.09 v5.1, Sep. 15, 2009, the Internet <http://www.gsmworld.com/documents/DG_09_v51.doc>

SUMMARY OF INVENTION

Technical Problem

If a drive current to be supplied to a controlled oscillator of a PLL circuit can be reduced while preventing noise characteristics from becoming worse than the specifications, power consumption can be further reduced. However, when the amount of the drive current for the controlled oscillator is changed, a jump may occur in oscillation frequency or phase, causing a problem of unlocking of the PLL circuit. Accordingly, it is common for conventional PLL circuits to fix a drive current to be supplied to a controlled oscillator to a constant value.

Unlocking of a PLL circuit may also occur in a case where a drive current to be supplied to a frequency divider is changed, and in a case where an amplifier in a transmission output stage is switched ON or OFF when switching of transmission and reception is performed in Time Division Duplex (TDD).

One object of the present invention is to make it possible to shorten a period of time taken until a PLL circuit, even if it is unlocked, is relocked, by suppressing the amount of a jump of an oscillation frequency.

Solution to Problem

A semiconductor device in accordance with one embodiment of the present invention includes a controlled oscillator and a control unit. The controlled oscillator includes a resonance circuit, an amplification unit, and a current adjustment unit. The resonance circuit includes one or a plurality of inductors and a first capacitive unit having a variable capacitance value. The amplification unit is connected to the resonance circuit, and outputs a local oscillation signal having an oscillation frequency corresponding to a resonance frequency of the resonance circuit. The current adjustment unit adjusts a value of a drive current to be supplied to the amplification unit. The control unit controls the capacitance value of the first capacitive unit and the current adjustment unit. When the control unit instructs the current adjustment unit to change the value of the drive current to be supplied to the amplification unit, the control unit also changes the capacitance value of the first capacitive unit.

Advantageous Effects of Invention

According to the semiconductor device in accordance with the above embodiment, when the control unit instructs the current adjustment unit to change the value of the drive current to be supplied to the amplification unit, the control unit also adjusts the capacitance value of the first capacitive unit. Therefore, in a PLL circuit including the controlled oscillator and the control unit configured as described above, the amount of a jump of the oscillation frequency due to a change in the drive current can be suppressed by adjusting the capacitance value of the first capacitive unit, and thus unlocking can be prevented. Even if unlocking occurs, a period of time taken until relocking is achieved can be shortened.

DESCRIPTION OF EMBODIMENTS

Figure 1:
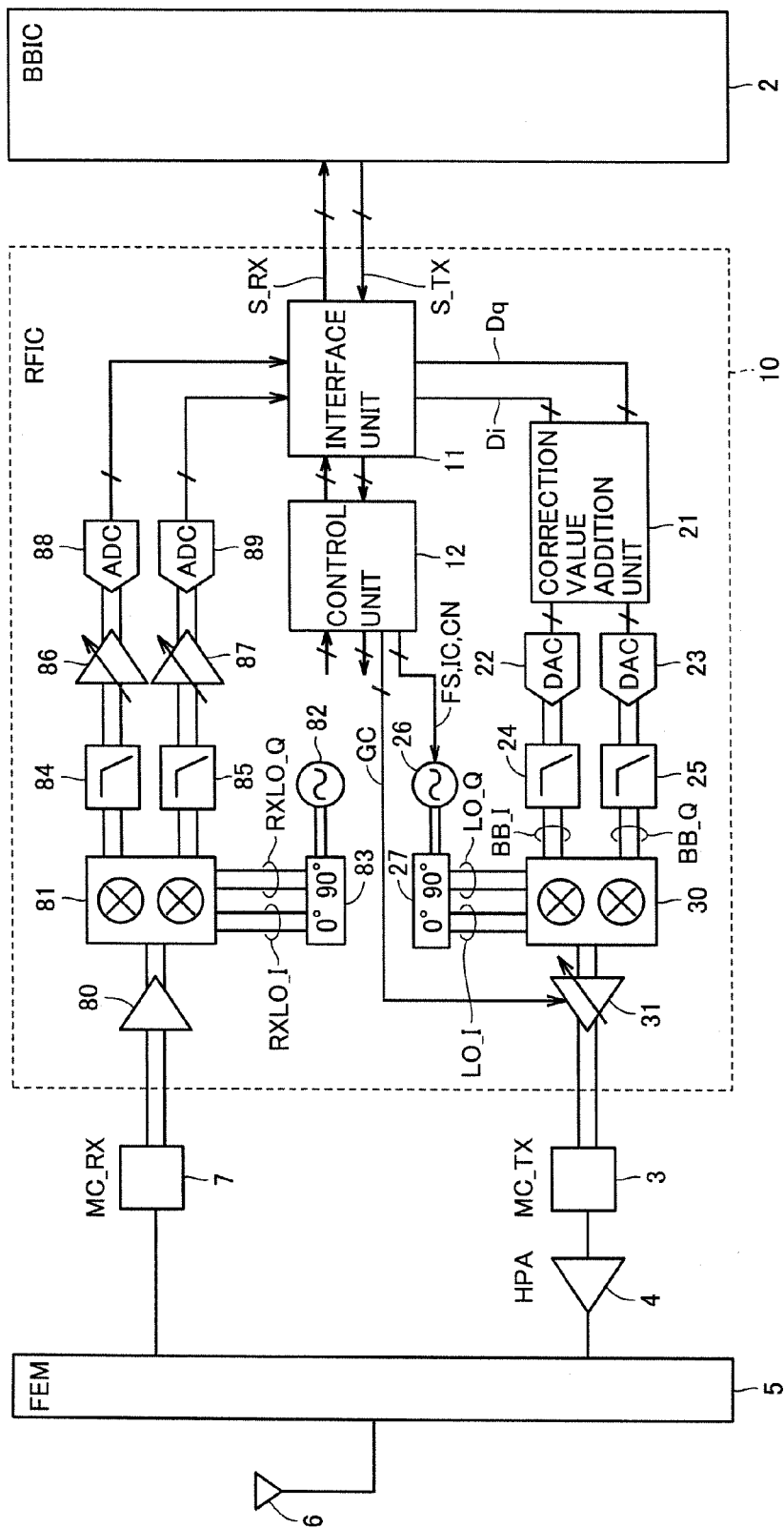
FIG. 1 is a block diagram showing an overall configuration of a communications instrument 1 equipped with an RFIC (semiconductor device) 10 in accordance with Embodiment 1 of the present invention.

Hereinafter, embodiments of the present invention will be described in detail with reference to the drawings. It is noted that identical or corresponding parts will be designated by the same reference characters, and the description thereof will not be repeated.

Embodiment 1

[Overall Configuration of Communications Instrument 1]

FIG. 1 is a block diagram showing an overall configuration of a communications instrument 1 equipped with an RFIC (semiconductor device) 10 in accordance with Embodiment 1 of the present invention. Communications instrument 1 includes: a baseband circuit (BBIC: Baseband IC) 2; RFIC 10; a converter 3 converting an impedance of a differential signal and converting the differential signal into a single-end signal; a power amplifier (HPA: High Power Amplifier) 4; a front-end module (FEM) 5; an antenna 6; and a converter 7 converting a single-end signal into a differential signal and converting an impedance of the differential signal.

Hereinafter, the operation of each unit will be briefly described, separately for the operation performed at the time of transmission and the operation performed at the time of reception. In the description below, a non-inverted signal and an inverted signal constituting a differential signal XX are distinguished from each other by adding suffixes T (non-inverted signal) and B (inverted signal), respectively, to a reference character XX, like XX_T and XX_B. Transmission may be indicated by TX, and reception may be indicated by RX.

First, at the time of transmission, baseband circuit 2 generates an I signal and a Q signal as a quadrature-phase component based on transmission data. The generated I signal and Q signal are converted into a serial differential signal S_TX together with a control signal to RFIC 10, and output to RFIC 10 by LVDS (Low Voltage Differential Signaling). Serial differential signal S_TX is subjected to serial-parallel conversion in an interface unit 11 of RFIC 10, and separated into an I signal Di and a Q signal Dq, and the control signal to RFIC 10.

As a configuration of a transmission device, RFIC 10 includes a correction value addition unit 21, DACs (Digital-to-Analog Converters) 22, 23, LPFs (Low Pass Filters) 24, 25, a local oscillator 26, a phase shifter 27, a quadrature modulator 30, and a TXPGA 31 (PGA: Programmable Gain Amplifier) controlling transmission power.

To digital I signal Di and Q signal Dq output from interface unit 11, first and second offset correction values are added, respectively, by correction value addition unit 21. The offset correction values are intended to suppress carrier leak in quadrature modulator 30.

DACs 22, 23 convert I signal Di and Q signal Dq subjected to offset correction into analog differential signals, respectively. The I signal and Q signal subjected to offset correction and then analog conversion pass through LPFs 24, 25, respectively, and thereafter are input to quadrature modulator 30 as differential baseband signals BB_I and BB_Q, respectively.

Quadrature modulator 30 further receives a local oscillation signal LO_I and a local oscillation signal LO_Q, which are analog differential signals generated in phase shifter 27 based on an output signal of local oscillator 26. Here, local oscillation signals LO_I and LO_Q have a phase difference of 90 degrees, and the phase of LO_Q is behind the phase of LO_I. Local oscillation signals LO_I, LO_Q may be generated by a ½ frequency divider instead of phase shifter 27.

Quadrature modulator 30 multiplies the BB_I signal by the LO_I signal and also multiplies the BB_Q signal by the LO_Q signal, subtracts one of these multiplication results from the other, and thereby generates a transmission signal in a transmission frequency band and outputs it to TXPGA 31.

The transmission signal input to TXPGA 31 is subjected to transmission power adjustment in accordance with the control signal, and thereafter converted from a differential signal to a single-end signal by converter 3.

Power amplifier 4 amplifies the transmission signal output from converter 3. The amplified transmission signal is supplied to antenna 6 via front-end module 5, and emitted from antenna 6. Front-end module 5 is a module including duplexers each separating a transmission signal from a reception signal, and switches switching connection between antenna 6 and the duplexers prepared for respective transmission/reception frequency bands.

Next, at the time of reception, a reception signal received at antenna 6 is input to converter 7 via front-end module 5. Converter 7 converts the reception signal as a single-end signal into a differential signal and performs impedance conversion on the signal, then sends it to RFIC 10.

As a configuration of a reception device, RFIC 10 includes an LNA (Low Noise Amplifier) 80, a quadrature demodulator 81, a local oscillator 82, a phase shifter 83, LPFs 84, 85, RXPGAs 86, 87, and ADCs (Analog-to-Digital Converters) 88, 89.

The reception signal input from converter 7 is amplified by LNA 80, and then input to quadrature demodulator 81. In addition to the output of LNA 80, quadrature demodulator 81 further receives a local oscillation signal RXLO_I and a local oscillation signal RXLO_Q, which are analog differential signals generated in phase shifter 83 based on an output signal of local oscillator 82. Here, local oscillation signals RXLO_I and RXLO_Q have a phase difference of 90 degrees, and the phase of RXLO_Q is behind the phase of RXLO_I. Local oscillation signals RXLO_I, RXLO_Q may be generated by a ½ frequency divider instead of phase shifter 83.

Quadrature demodulator 81 generates a baseband I signal by multiplying the reception signal by local oscillation signal RXLO_I, and generates a baseband Q signal by multiplying the reception signal by local oscillation signal RXLO_Q.

Unwanted waves of the baseband I signal and the baseband Q signal generated by quadrature demodulator 81 are removed by LPFs 84, 85, and then the levels of the baseband I signal and the baseband Q signal are adjusted by RXPGAs 86, 87, respectively. The I signal and the Q signal that have passed through RXPGAs 86, 87 are subjected to digital conversion by ADCs 88, 89, respectively. Thereafter, the baseband I signal and the baseband Q signal are converted into a serial differential signal S_RX by interface unit 11, and output to baseband circuit 2 by LVDS. Baseband circuit 2 demodulates the reception signal based on serial differential signal S_RX including the received I signal and Q signal.

RFIC 10 further includes a control unit 12. Control unit 12 receives the control signal from baseband circuit 2 separated by interface unit 11 to control each component of the transmission device and the reception device described above. For example, control unit 12 outputs a gain adjustment code GC for controlling a gain of TXPGA 31, and control codes FS, IC, CN for controlling local oscillator 26.

[Configurations of Local Oscillator 26 and Control Unit 12]

Figure 2:
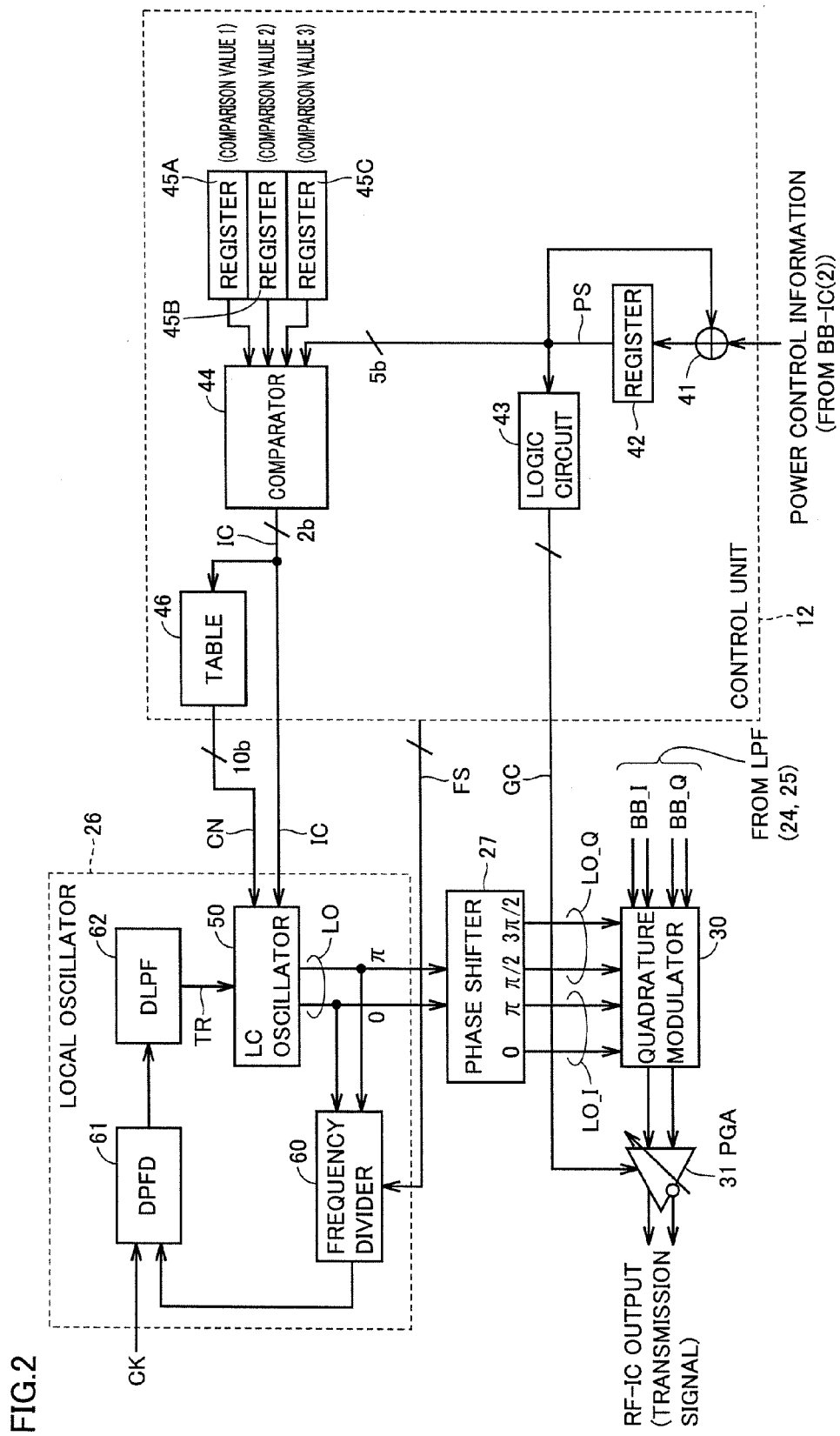
FIG. 2 is a block diagram showing a configuration of a local oscillator 26 in FIG. 1 and a configuration of a portion of a control unit 12 in FIG. 1 related to control of local oscillator 26.

FIG. 2 is a block diagram showing a configuration of local oscillator 26 in FIG. 1 and a configuration of a portion of control unit 12 in FIG. 1 related to control of local oscillator 26. FIG. 2 also shows phase shifter 27, quadrature modulator 30, and TXPGA 31 in FIG. 1.

Referring to FIG. 2, local oscillator 26 is an All Digital PLL circuit including an LC oscillator (digital controlled oscillator) 50, a frequency divider (DIV) 60, a digital phase comparator (DPFD: Digital Phase Frequency Detector) 61, and a digital low pass filter (DLPF) 62.

LC oscillator 50 oscillates at a frequency corresponding to the value of a digital output (a tracking code TR) of digital low pass filter 62. An output signal of LC oscillator 50 (a local oscillation signal LO) is a differential signal (0, π). Upon receiving differential output signal LO, phase shifter 27 generates local oscillation signals LO_I (0, π) and LO_Q (π/2, 3π/2) having phases different from each other by 90 degrees. A detailed configuration of LC oscillator 50 will be described in FIG. 3.

Frequency divider 60 outputs a frequency-divided signal of the output signal of LC oscillator 50 (local oscillation signal LO).

Digital phase comparator 61 (phase comparison unit) detects a phase difference between a clock signal CK output from, for example, a temperature-compensated crystal oscillator (not shown) and the output signal of frequency divider 60, and outputs a phase difference signal corresponding to the detected phase difference. For example, digital phase comparator 61 detects clock signal CK and a time difference between rising times (or falling times) of clock signal CK.

Digital low pass filter 62 is a digital filter limiting a frequency band of the phase difference signal output from digital phase comparator 61. Noise components in a higher frequency range of the phase difference signal are removed by digital low pass filter 62.

LC oscillator 50, frequency divider 60, digital phase comparator 61, and digital low pass filter 62 described above constitute a feedback loop. Through the feedback loop, feedback is performed until the frequency of the signal output from frequency divider 60 matches the frequency of clock signal CK. Such matching of the frequencies is referred to as locking. In a state where the frequencies are locked, the frequency of local oscillation signal LO matches a value obtained by multiplying the frequency of clock signal CK by a frequency division ratio.

Next, the configuration of control unit 12 related to control of local oscillator 26 will be described. Referring to FIG. 2, control unit 12 includes an adder 41, registers 42, 45A, 45B, 45C, a logic circuit 43, a comparator 44, and a table storage unit 46.

Control unit 12 receives power control information (+1: power increased, −1: power decreased, 0: power maintained) from baseband circuit 2 in FIG. 1. Adder 41 adds the power control information to data held in register 42. The result of addition by adder 41 is overwritten in register 42. As a result, a setting value PS of present output power of communications instrument 1 is held in register 42. In the case of FIG. 2, setting value PS of the output power is 5-bit digital data. Logic circuit 43 converts setting value PS of the output power into gain adjustment code GC and outputs it to TXPGA 31. An output of TXPGA 31 varies depending on the value of gain adjustment code GC.

Comparator 44 compares setting value PS of the present output power held in register 42 with comparison values 1, 2, 3 (for example, comparison value 1<comparison value 2<comparison value 3) held in registers 45A, 45B, 45C, respectively, and thereby converts 5-bit setting value PS of the output power into 2-bit current adjustment code IC. In accordance with current adjustment code IC, the value of a drive current to be supplied to LC oscillator 50 is adjusted. By adjusting the drive current in accordance with setting value PS of the output power as described above, power consumption in RFIC 10 can be reduced. The number of bits of current adjustment code IC is not limited to two bits. For example, when one comparison value is compared with setting value PS of the output power, 1-bit current adjustment code IC is generated by comparator 44.

When the value of current adjustment code IC is changed corresponding to setting value PS of the output power, a jump generally occurs in an oscillation frequency of LC oscillator 50. Table storage unit 46 stores the value of cancel code CN preset to be associated with a change in the value of current adjustment code IC. As described in detail in FIGS. 8 to 15, when the value of current adjustment code IC is changed, corresponding cancel code CN is output from table storage unit 46. In response to cancel code CN, a capacitance value of a capacitive unit included in LC oscillator 50 is adjusted, and thereby a jump of the oscillation frequency of LC oscillator 50 is suppressed.

Control unit 12 further outputs frequency setting code FS changing the frequency division ratio of frequency divider 60 in order to set an oscillation frequency of local oscillator 26 based on the control signal received from baseband circuit 2 in FIG. 1.

Unlike the above description, phase comparator 61 and low pass filter 62 can each be constituted by an analog circuit. In this case, LC oscillator 50 oscillates at a frequency corresponding to the value of a control voltage output from low pass filter 62. In this specification, a digital code and an analog control voltage will also be collectively referred to as a control signal.

[Configuration of LC Oscillator 50]

Figure 3:
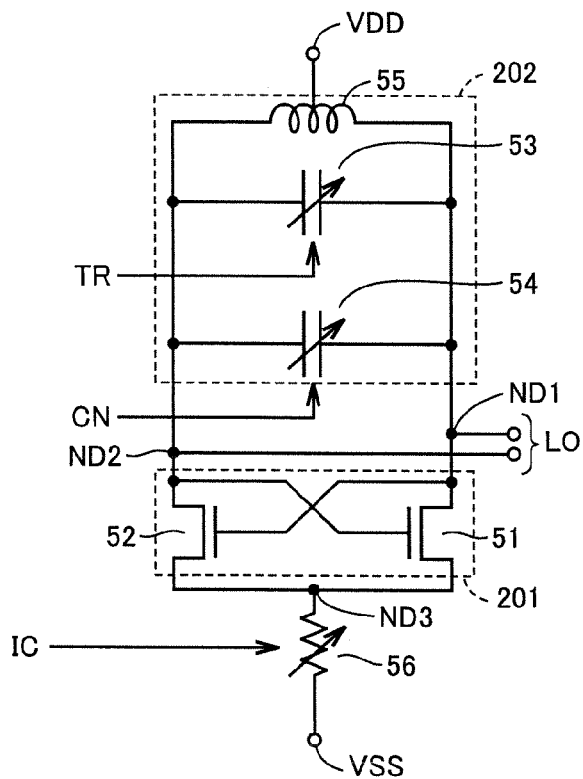
FIG. 3 is a circuit diagram showing an exemplary configuration of an LC oscillator 50 in FIG. 2.

FIG. 3 is a circuit diagram showing an exemplary configuration of LC oscillator 50 in FIG. 2. Referring to FIG. 3, LC oscillator 50 includes an amplification unit 201, an LC resonance circuit 202, and a current adjustment unit 56. LC oscillator 50 outputs differential local oscillation signal LO having an oscillation frequency corresponding to a resonance frequency of LC resonance circuit 202, from output nodes ND1, ND2.

Amplification unit 201 includes a pair of cross-coupled NMOS (Negative-channel Metal Oxide Semiconductor) transistors 51, 52. NMOS transistor 51 has a drain connected to first output node ND1, a gate connected to second output node ND2, and a source connected to a connection node ND3. NMOS transistor 52 has a drain connected to second output node ND2, a gate connected to first output node ND1, and a source connected to connection node ND3.

LC resonance circuit 202 is connected to amplification unit 201 as a load of NMOS transistors 51, 52. LC resonance circuit 202 includes a capacitive unit 53, a capacitive unit 54, and an inductor 55 connected in parallel with one another between output nodes ND1 and ND2. Capacitive unit 53 has a capacitance value varying in accordance with the value of tracking code TR output from digital low pass filter 62 in FIG. 2. Capacitive unit 54 is an additional capacitor having a capacitance value varying in accordance with the value of cancel code CN output from control unit 12. The resonance frequency of LC resonance circuit 202 is mainly determined by the capacitance value of capacitive unit 53 and an inductance value of inductor 55. The midpoint of inductor 55 is connected to a power supply node VDD.

Current adjustment unit 56 is connected between connection node ND3 and a power supply node VSS (ground node).

Current adjustment unit 56 has a resistance value varying in accordance with the value of current adjustment code IC output from control unit 12 in FIG. 2, and thereby the magnitude of a drive current for amplification unit 201 (collector currents of transistors 51, 52) flowing from power supply node VDD to power supply node VSS varies.

Figure 4:
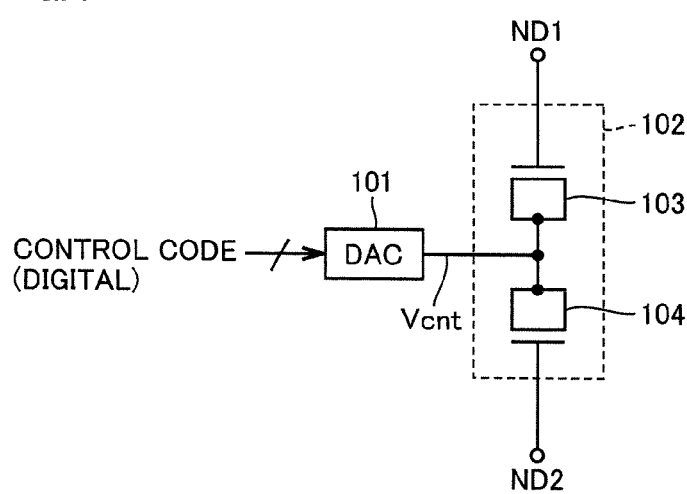
FIG. 4 is a view showing an exemplary configuration of a capacitive unit 53, 54 shown in FIG. 3.

FIG. 4 is a view showing an exemplary configuration of capacitive unit 53, 54 shown in FIG. 3. Referring to FIG. 4, each of capacitive units 53, 54 includes a digital-to-analog converter (DAC) 101 and a voltage-controlled capacitor 102. Digital-to-analog converter 101 converts the control code (tracking code TR or cancel code CN) into an analog control voltage Vcnt. Voltage-controlled capacitor 102 includes MOS transistor capacitors (MOSFET Capacitors) 103, 104 connected in series. Voltage-controlled capacitor 102 has a capacitance value varying in accordance with control voltage Vcnt applied to a connection node between MOS transistor capacitors 103, 104.

Figure 5:
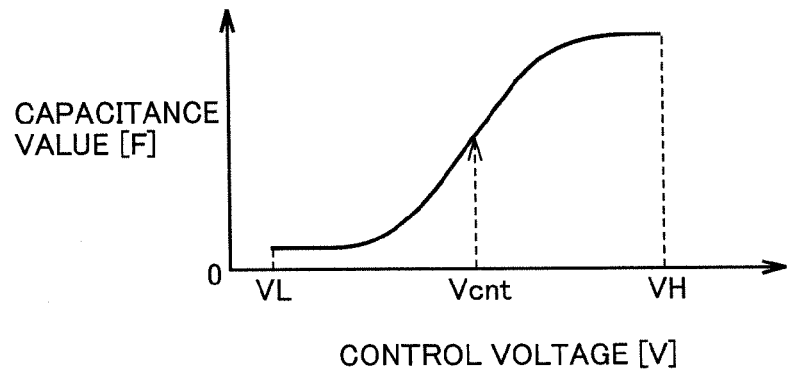
FIG. 5 is a view showing the relation between a control voltage and a capacitance value in a voltage-controlled capacitor 102 in FIG. 4.

FIG. 5 is a view showing the relation between the control voltage and the capacitance value in voltage-controlled capacitor 102 in FIG. 4. The capacitance value of voltage-controlled capacitor 102 is determined by control voltage Vcnt (minimum value: VL, maximum value: VH) corresponding to the control code.

Figure 6:
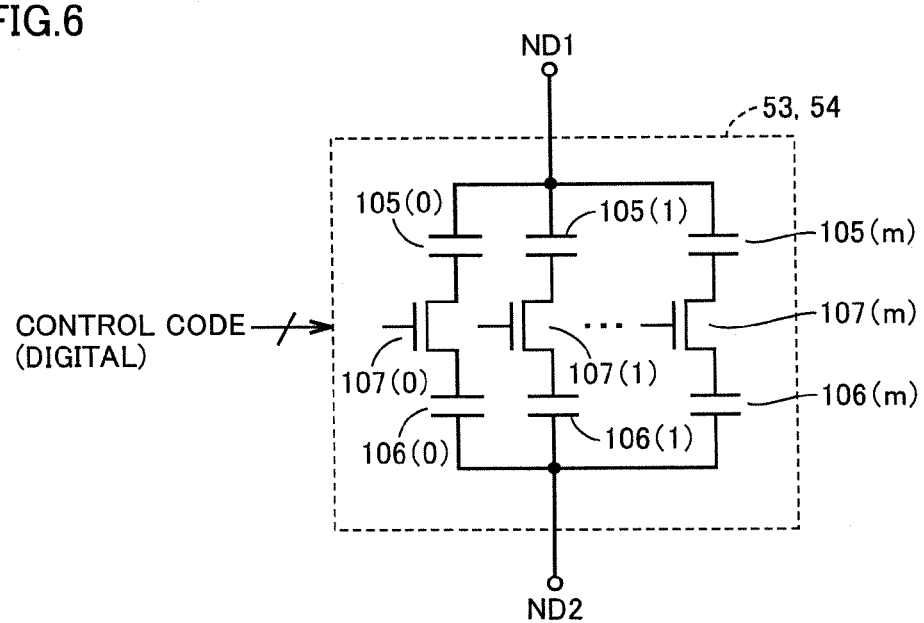
FIG. 6 is a view showing another exemplary configuration of capacitive unit 53, 54 shown in FIG. 3.

FIG. 6 is a view showing another exemplary configuration of capacitive unit 53, 54 shown in FIG. 3. Referring to FIG. 6, each of capacitive units 53, 54 includes capacitive elements 105(0) to 105(m), capacitive elements 106(0) to 106(m), and NMOS transistors 107(0) to 107(m) as switching elements, where m is an integer determined in accordance with the bit number of the control code (tracking code TR or cancel code CN). The i-th ($0 \leq i \leq n$) capacitive element 105(i), NMOS transistor 107(i), and capacitive element 106(i) constitute a series-connected body by being connected in series between output nodes ND1 and ND2. These m+1 series-connected bodies are connected in parallel with one another. The capacitance value of capacitive unit 53, 54 is changed by each of NMOS transistors 107(0) to 107(m) being switched ON or OFF in accordance with the value of the control code (tracking code TR, cancel code CN).

Figure 7:
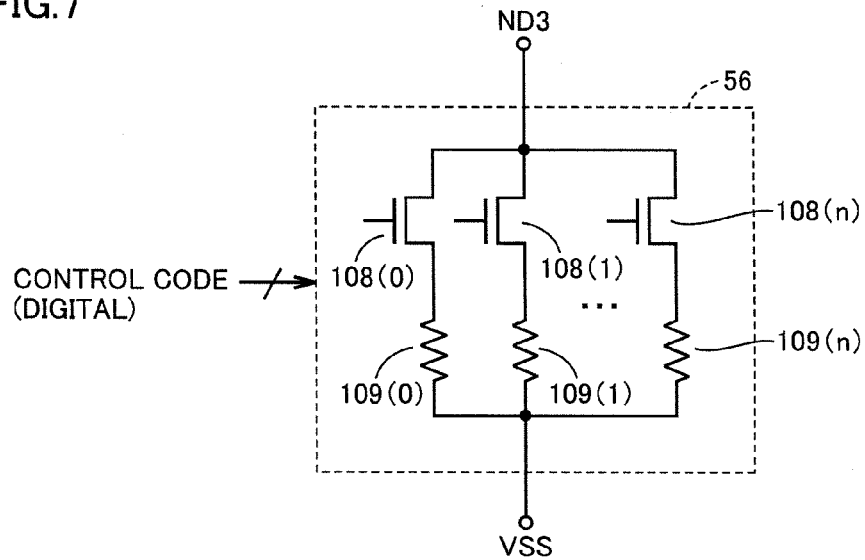
FIG. 7 is a view showing an exemplary configuration of a current adjustment unit 56 shown in FIG. 3.

FIG. 7 is a view showing an exemplary configuration of current adjustment unit 56 shown in FIG. 3. Referring to FIG. 7, current adjustment unit 56 includes NMOS transistors 108(0) to 108(n) as switching elements, and resistive elements 109(0) to 109(n), where n is an integer determined in accordance with the bit number of the control code (current adjustment code IC). The i-th ($0 \leq i \leq n$) NMOS transistor 108(i) and resistive element 109(i) constitute a series-connected body by being connected in series between connection node ND3 and power supply node VSS. These n+1 series-connected bodies are connected in parallel with one another. The resistance value of current adjustment unit 56 is changed by each of NMOS transistors 108(0) to 108(n) being switched ON or OFF in accordance with the value of the control code (current adjustment code IC).

[Method for Suppressing Jump of Oscillation Frequency]

Next, a method for suppressing a jump of the oscillation frequency when current adjustment code IC is changed will be described. First, a description will be given of a case where adjustment of the oscillation frequency is not performed by capacitive unit 54 in FIG. 3, that is, a case where a jump of the oscillation frequency is not suppressed.

Figure 8:
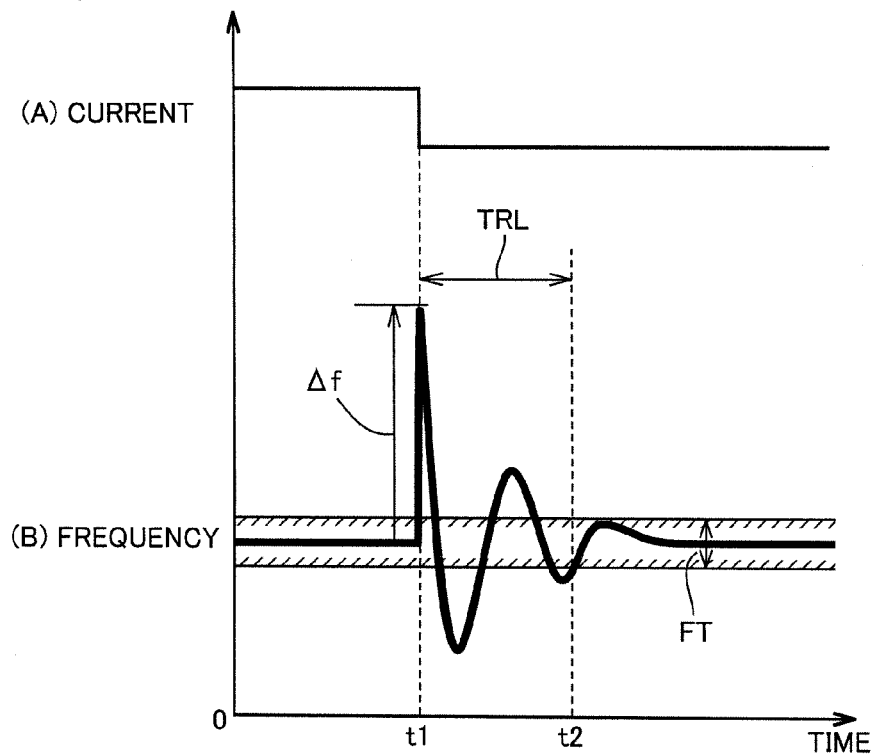
FIG. 8 is a view showing a change in oscillation frequency when a current adjustment code IC is changed in LC oscillator 50 in FIG. 3 (in a case where adjustment of the oscillation frequency is not performed by capacitive unit 54).

FIG. 8 is a view showing a change in oscillation frequency when current adjustment code IC is changed in LC oscillator 50 in FIG. 3. In FIG. 8, the upper graph (A) represents a temporal change in the current flowing to LC oscillator 50, and the lower graph (B) represents a temporal change in the oscillation frequency of LC oscillator 50.

Referring to FIGS. 3 and 8, the value of current adjustment code IC is changed at time t1, and thereby the drive current flowing through the controlled oscillator is changed. Due to the change in the drive current, a jump of Δf occurs in the oscillation frequency. The oscillation frequency is restored to the original oscillation frequency over time by the action of a PLL. A period of time taken until the oscillation frequency falls within an acceptable range FT (i.e., from time t1 to time t2) will be referred to as a relocking time period TRL.

Figure 9:
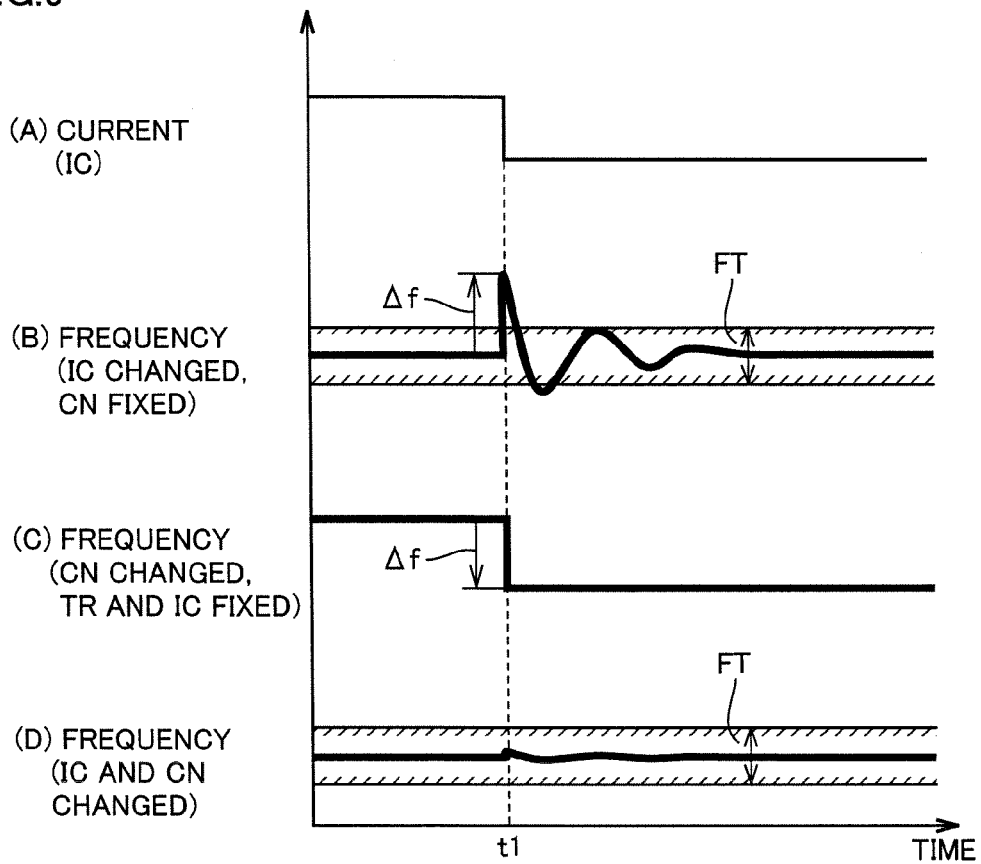
FIG. 9 is a view showing a change in oscillation frequency when current adjustment code IC is changed in LC oscillator 50 in FIG. 3 (in a case where adjustment of the oscillation frequency is performed by capacitive unit 54).

FIG. 9 is a view showing a change in oscillation frequency when current adjustment code IC is changed in LC oscillator 50 in FIG. 3. In the case of FIG. 9, adjustment of the oscillation frequency is performed by capacitive unit 54 in FIG. 3. In FIG. 9, graph (A) represents a temporal change in the drive current corresponding to the value of current adjustment code IC. Graph (B) represents a temporal change in the oscillation frequency when the value of current adjustment code IC is changed with cancel code CN being set constant. Graph (C) represents the amount of a change in the oscillation frequency corresponding to a change in the value of cancel code CN (with tracking code TR and current adjustment code IC being set constant). Graph (D) represents a temporal change in the oscillation frequency when the values of current adjustment code IC and the cancel code are both changed.

Referring to FIGS. 3 and 9, the value of current adjustment code IC is changed at time t1, and thereby the drive current flowing through the controlled oscillator is changed. When adjustment of the capacitance value of capacitive unit 54 is not performed by cancel code CN, jump Δf of the oscillation frequency occurs immediately after time t1, as shown in graph (B). In order to suppress jump Δf of the oscillation frequency, cancel code CN is changed simultaneously with the change of current adjustment code IC at time t1, and thereby the capacitance value of capacitive unit 54 is changed so as to cancel the jump of the oscillation frequency in graph (B) (see graph (C)). As shown in graph (D), the jump of the oscillation frequency at time t1 is suppressed by changing both current adjustment code IC and cancel code CN, and thus the oscillation frequency is maintained within acceptable range FT. For cancel code CN after time t1, the value prestored in table storage unit 46 so as to be associated with a change in the value of current adjustment code IC is used. Hereinafter, a method for creating a table to be prestored in table storage unit 46 will be described. The table is created during calibration.

Figure 10:
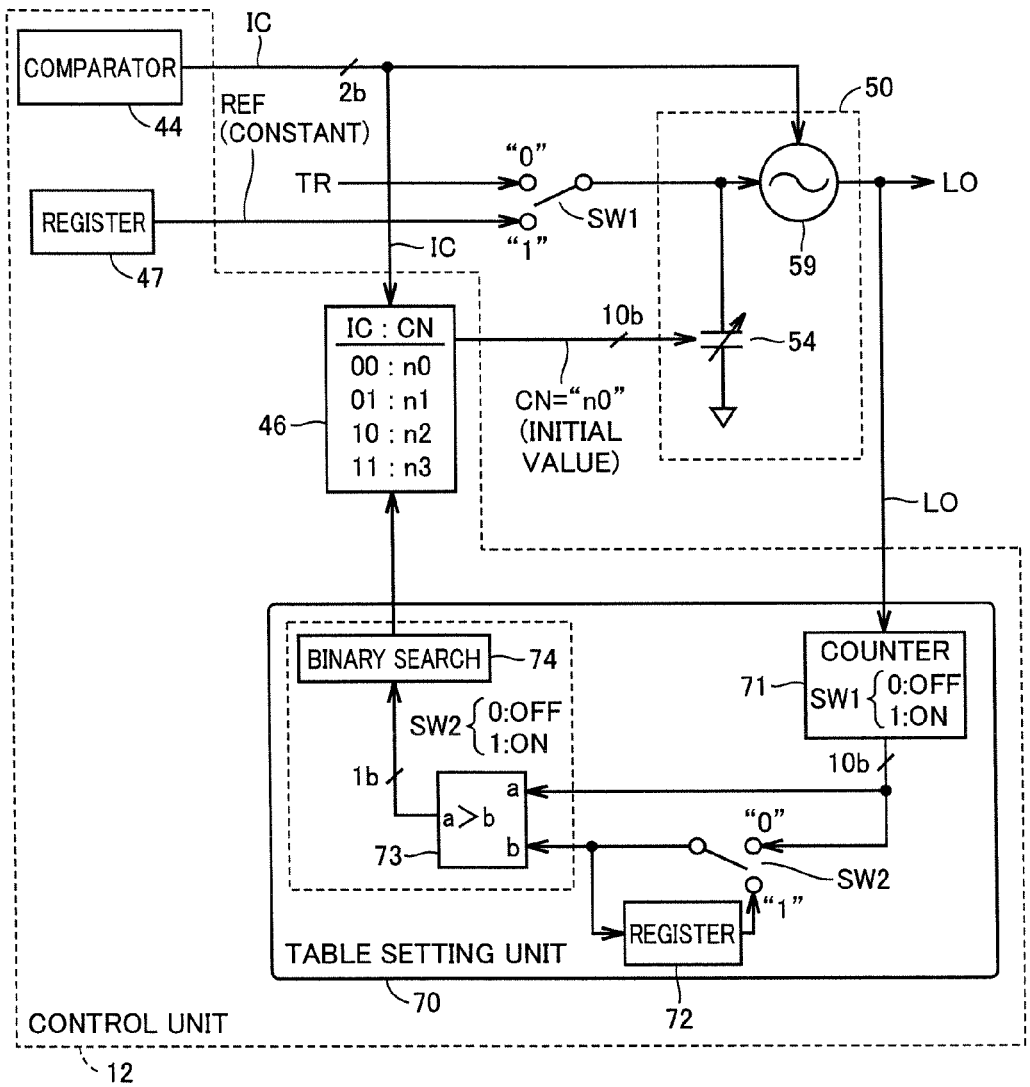
FIG. 10 is a block diagram showing portions of local oscillator 26 and control unit 12 in FIG. 2 related to creation of a table.

FIG. 10 is a block diagram showing portions of local oscillator 26 and control unit 12 in FIG. 2 related to creation of the table. In FIG. 10, LC oscillator 50 is shown to be separated into capacitive unit 54 and other units 59.

Referring to FIGS. 2, 3, and 10, local oscillator 26 further includes a switching unit SW1, in addition to the configuration in FIG. 2. Control unit 12 further includes a register 47 and a table setting unit 70, in addition to the configuration in FIG. 2. Register 47 holds a preset reference code REF. As reference code REF, for example, a median value of a range in which tracking code TR can be set is used.

Switching unit SW1 receives tracking code TR output from digital low pass filter 62 and reference code REF output from register 47, and outputs one of these control codes to capacitive unit 53 of LC oscillator 50 in accordance with an instruction from control unit 12. During calibration, register 47 and LC oscillator 50 are connected by switching unit SW1 (SW1="1"), and thereby the oscillation frequency of LC oscillator 50 is subjected to open-loop control. During normal operation, digital low pass filter 62 and LC oscillator 50 are connected by switching unit SW1 (SW1="0"), and thereby the oscillation frequency of LC oscillator 50 is subjected to closed-loop control.

Table setting unit 70 includes a frequency counter 71, a register 72, a comparator 73, a binary search logic 74, and a switching unit SW2. Frequency counter 71 receives local oscillation signal LO output from LC oscillator 50, and enters an operation state (ON state) during calibration (SW1="1") to detect the frequency of local oscillation signal LO. Data of the detected frequency (for example, 10-bit data) is output to comparator 73 and switching unit SW2. During normal operation (SW1="0"), frequency counter 71 enters a stopped state (OFF state).

Switching unit SW2 switches whether or not to connect frequency counter 71 and register 72. When frequency counter 71 and register 72 are connected (SW2="0"), register 72 holds the frequency data output from frequency counter 71. When frequency counter 71 and register 72 are not connected (SW2="1"), register 72 is connected to an input terminal b of comparator 73, and outputs the held frequency data to comparator 73. Hereinafter, a case where register 72 and frequency counter 71 are connected by switching unit SW2 (SW2="0") will be referred to as a mode 1, and a case where register 72 and frequency counter 71 are not connected by switching unit SW2 (SW2="1") will be referred to as a mode 2.

Comparator 73 enters a stopped state (OFF state) in mode 1 (SW2="0"), and enters an operation state (ON state) in mode 2 (SW2="1"). In the operation state, comparator 73 compares the frequency data output from frequency counter 71 with the frequency data held in register 72, and outputs a comparison result (1-bit data) to binary search logic 74. For example, when a value input to a terminal a in FIG. 10 is more than a value input to terminal b (a>b), comparator 73 outputs "1", and when a value input to terminal a is not more than a value input to terminal b (a≤b), comparator 73 outputs "0".

Binary search logic 74 enters a stopped state (OFF state) in mode 1 (SW2="0"), and enters an operation state (ON state) in mode 2 (SW2="1"). During calibration (SW1="1"), control unit 12 changes the value of current adjustment code IC simultaneously with mode switching from mode 1 (SW2="0") to mode 2 (SW2="1"). Binary search logic 74 determines the value of cancel code CN to be supplied in mode 2 (SW2="1") after the change of the value of current adjustment code IC by a binary search method, such that frequencies of local oscillation signal LO detected before and after the change of the value of current adjustment code IC will be equal.

Specifically, binary search logic 74 sets the entire range from the minimum value to the maximum value of cancel code CN as an initial search range, and outputs a median value of the search range to table storage unit 46. The median value of the search range is output to capacitive unit 54 of LC oscillator 50 via table storage unit 46, and is used as cancel code CN. Based on the comparison result of comparator 73 for the value of cancel code CN, binary search logic 74 reduces the search range by half. The above process is repeated by the number of times equal to the bit number of cancel code CN, and thereby the value of cancel code CN is finally determined. Table storage unit 46 stores the determined value of cancel code CN so as to be associated with a change in the value of current adjustment code IC.

[Specific Example of Creation of Table]

Hereinafter, a procedure for determining the value of cancel code CN to be supplied after the change of current adjustment code IC, where current adjustment code IC has an initial value "00", cancel code CN has an initial value "n0" (which means a 10-bit binary number), and current adjustment code IC is changed from the initial value "00" to "01", will be described with reference to FIGS. 11 to 15.

Figure 11:
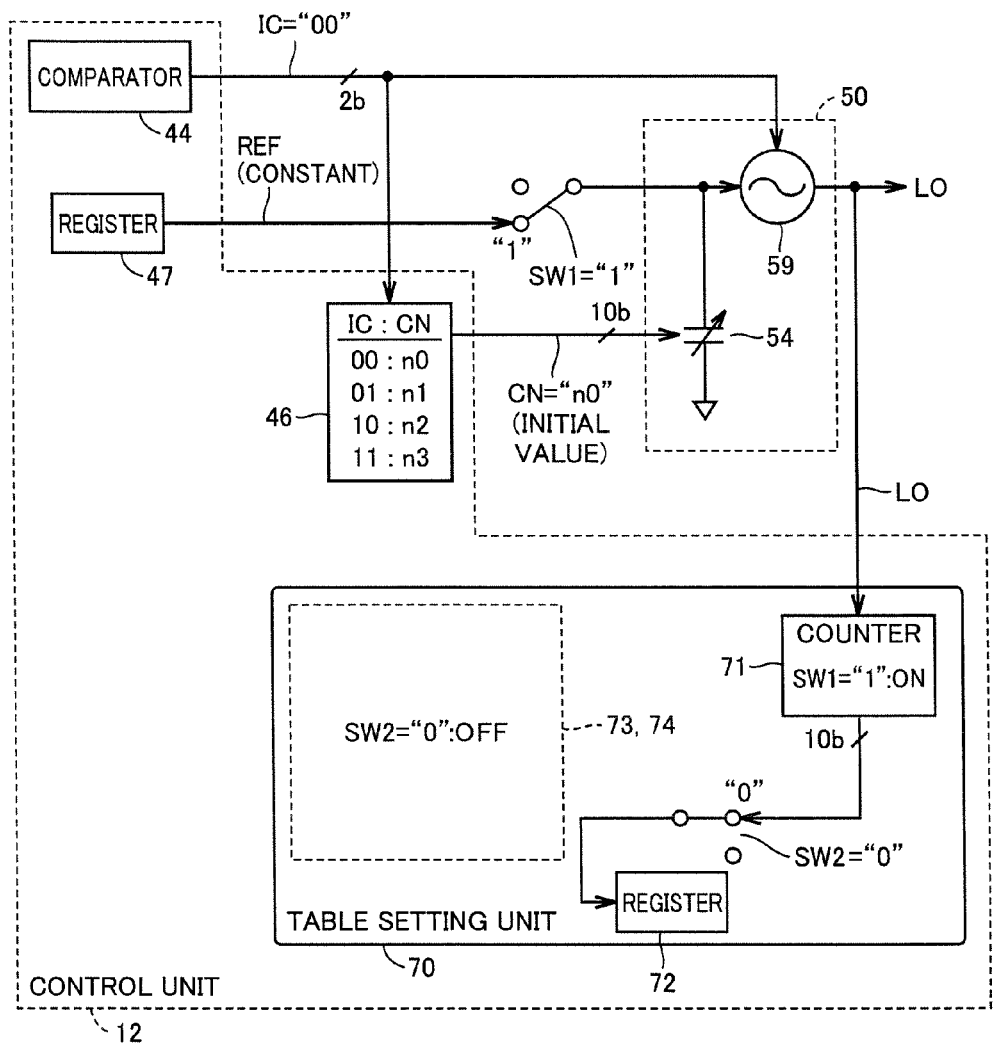
FIG. 11 is a view for illustrating an operation of control unit 12 in mode 1 (SW2="0") during calibration (SW1="1").

FIG. 11 is a view for illustrating an operation of control unit 12 in mode 1 (SW2="0") during calibration (SW1="1"). Referring to FIG. 11, control unit 12 outputs the initial value "00" as current adjustment code IC. During calibration, instead of tracking code TR, reference code REF having a constant value is input to LC oscillator 50. In this state, table setting unit 70 detects the frequency of local oscillation signal LO output from LC oscillator 50, and holds it in register 72.

Figure 12:
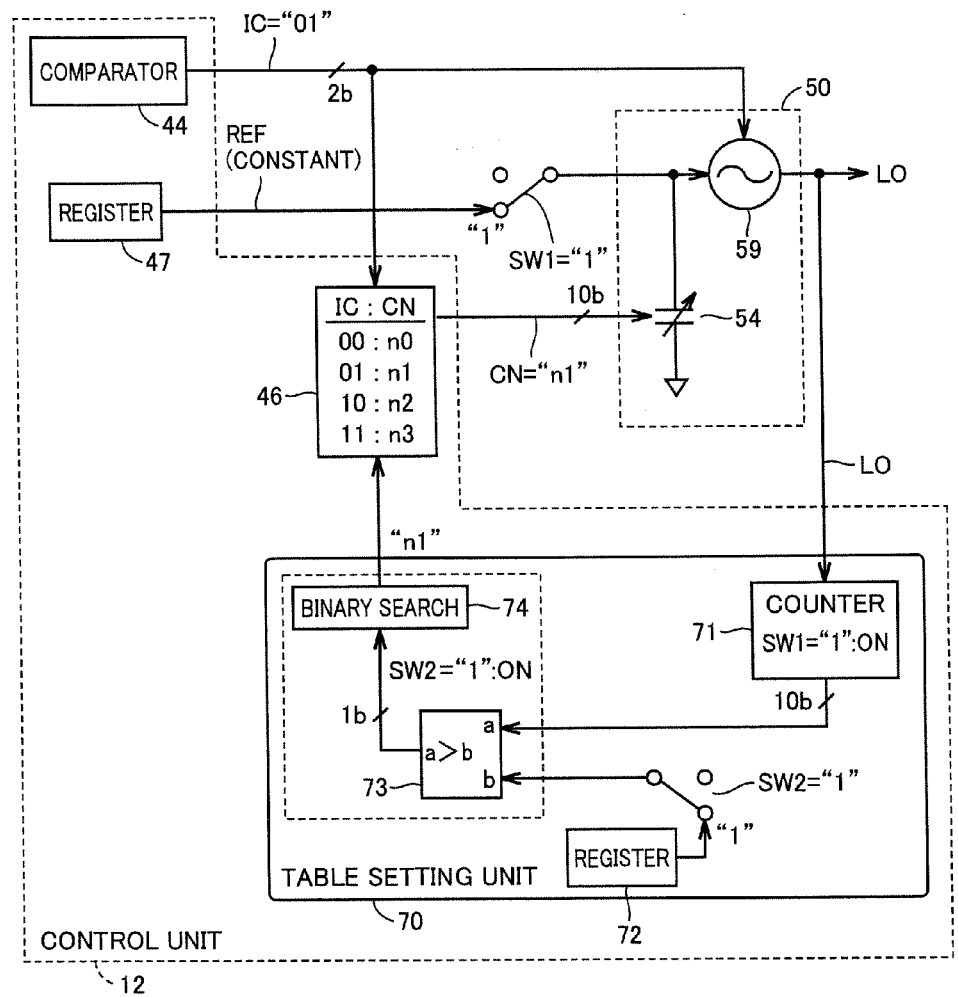
FIG. 12 is a view for illustrating an operation of control unit 12 in mode 2 (SW2="1") during calibration (SW1="1").

FIG. 12 is a view for illustrating an operation of control unit 12 in mode 2 (SW2="1") during calibration (SW1="1"). Referring to FIG. 12, control unit 12 outputs the changed value "01" as current adjustment code IC. During calibration, instead of tracking code TR, reference code REF having a constant value is input to LC oscillator 50. In this state, comparator 73 compares the value of the frequency of local oscillation signal LO detected by frequency counter 71 with data of the frequency held in register 72, and outputs a comparison result to binary search logic 74. Based on the comparison result of comparator 73, binary search logic 74 reduces the search range by half, and outputs a median value of a newly set search range to table storage unit 46. The output median value of the search range is supplied to capacitive unit 54 of LC oscillator 50 as cancel code CN. When cancel code CN is 10-bit data, the above process is repeated by 10 times, and thereby "n1" is determined as the final value of cancel code CN. The determined value "n1" is stored by table storage unit 46 so as to be associated with the changed value "01" of current adjustment code IC. Similarly, when the value of current adjustment code IC is changed from the initial value "00" to "10", "n2" is determined as the value of cancel code CN to be supplied after the change, and stored by table storage unit 46. When the value of current adjustment code IC is changed from the initial value "00" to "11", "n3" is determined as the value of cancel code CN to be supplied after the change, and stored by table storage unit 46.

Figure 13:
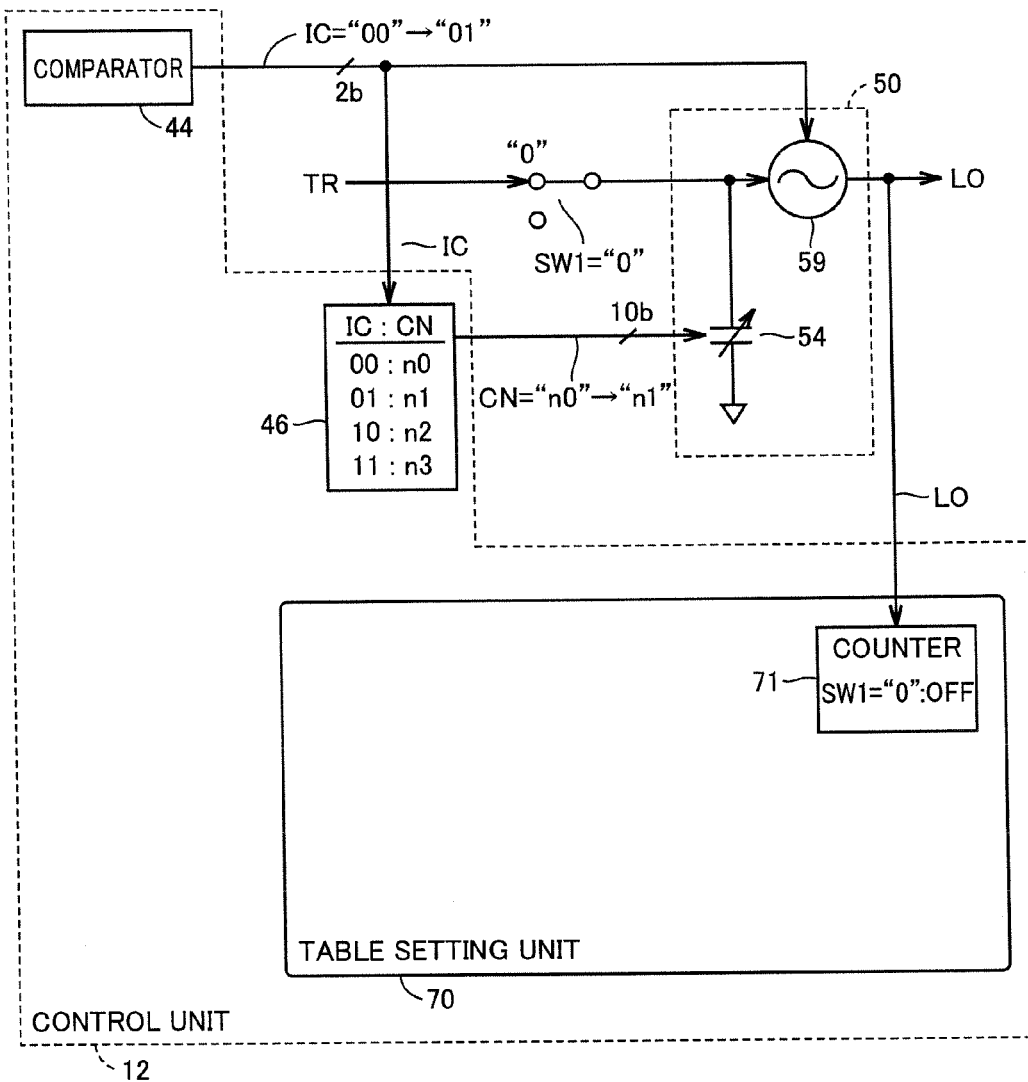
FIG. 13 is a view for illustrating an operation of control unit 12 during normal operation (SW1="0").

FIG. 13 is a view for illustrating an operation of control unit 12 during normal operation (SW1="0"). Referring to FIG. 13, during normal operation, tracking code TR output from the digital low pass filter in FIG. 2 is input to LC oscillator 50. Frequency counter 71 is in a stopped state (OFF state). On this occasion, when current adjustment code IC to be output from control unit 12 is changed from "00" to "01", in accordance with the change, cancel code CN to be output from table storage unit 46 to capacitive unit 54 is changed from "n0" to "n1", based on the table. As a result, a jump of the oscillation frequency when the current adjustment code is changed is suppressed.

Figure 14:
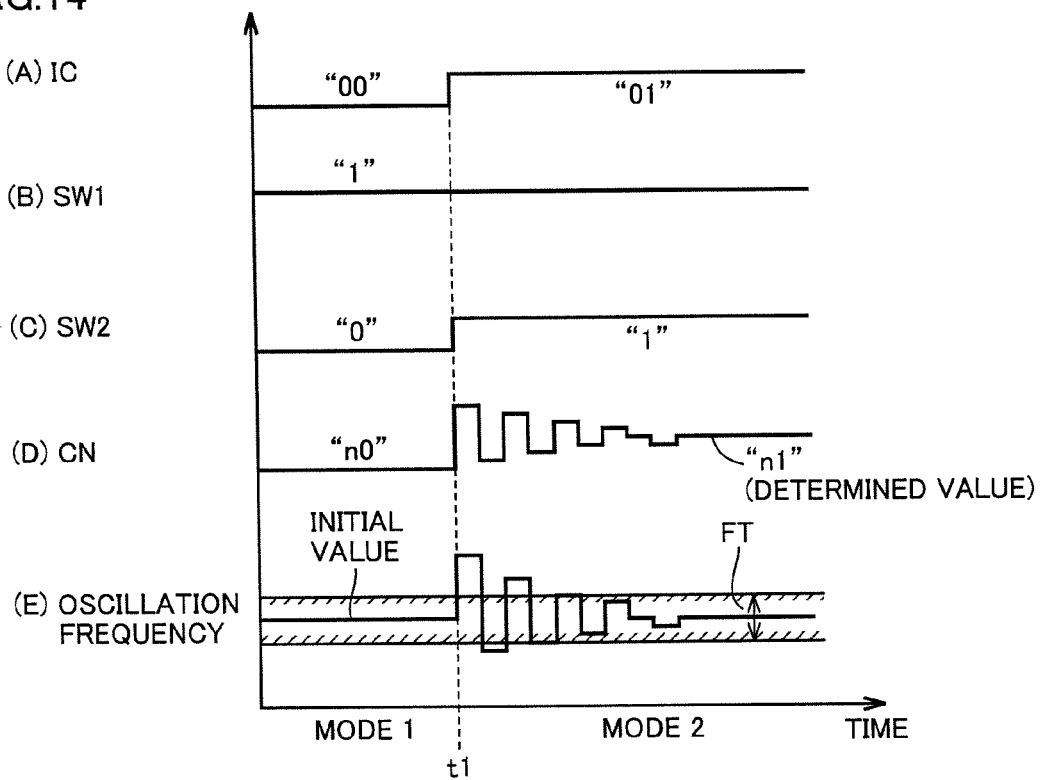
FIG. 14 is a timing chart showing states of switching units SW1, SW2, temporal changes in values of control codes IC, CN, and a temporal change in oscillation frequency, during calibration.

FIG. 14 is a timing chart showing states of switching units SW1, SW2, temporal changes in the values of control codes IC, CN, and a temporal change in oscillation frequency, during calibration. Graph (A) represents the temporal change in the value of current adjustment code IC, graph (B) represents the state of switching unit SW1, graph (C) represents the state of switching unit SW2, graph (D) represents the temporal change in the value of cancel code CN, and graph (E) represents the temporal change in the frequency (oscillation frequency) of local oscillation signal LO output from LC oscillator 50.

Referring to FIGS. 11, 12, and 14, in a calibration mode, switching unit SW1 is in the state of "1". At time t1, control unit 12 changes current adjustment code IC from "00" to "01" and also switches the state of switching unit SW2 from "0" to "1" to transition the operation mode from mode 1 to mode 2. After time t1, control unit 12 adjusts the value of cancel code CN by binary search logic 74 such that the oscillation frequency will be equal to the initial value before time t1, and finally determines the value of cancel code CN as "n1".

Figure 15:
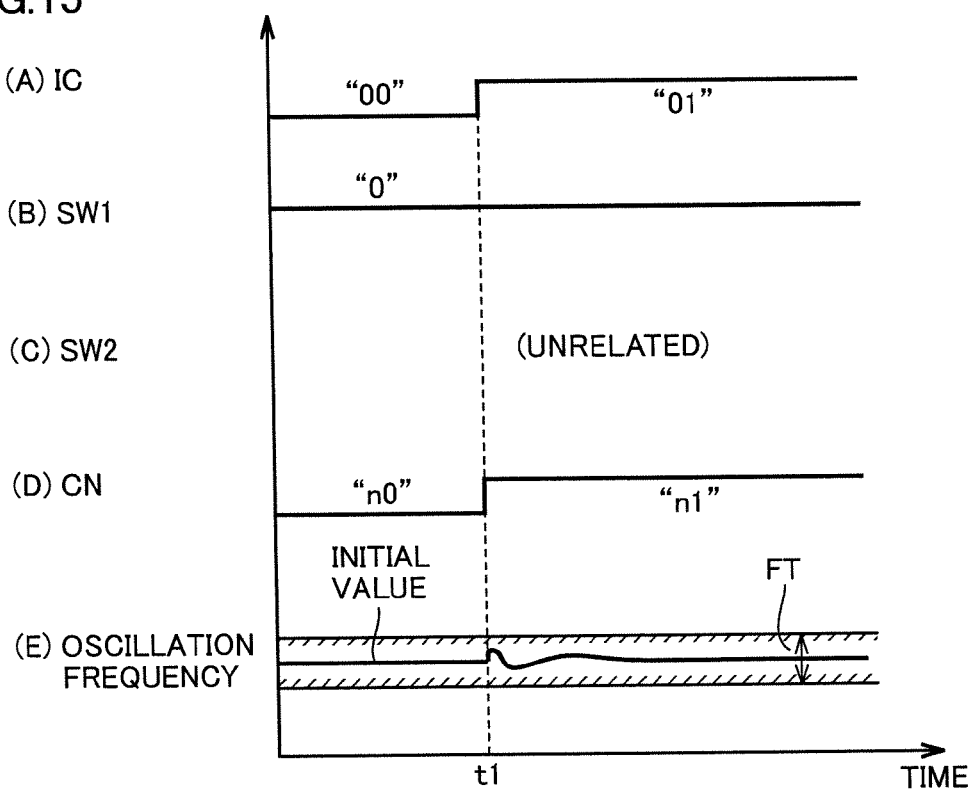
FIG. 15 is a timing chart showing states of switching units SW1, SW2, temporal changes in values of control codes IC, CN, and a temporal change in oscillation frequency, during normal operation.

FIG. 15 is a timing chart showing states of switching units SW1, SW2, temporal changes in values of control codes IC, CN, and a temporal change in oscillation frequency, during normal operation. Graph (A) represents the temporal change in the value of current adjustment code IC, graph (B) represents the state of switching unit SW1, graph (C) represents the state of switching unit SW2, graph (D) represents the temporal change in the value of cancel code CN, and graph (E) represents the temporal change in the frequency (oscillation frequency) of local oscillation signal LO output from LC oscillator 50.

Referring to FIGS. 13 and 15, during normal operation, switching unit SW1 is in the state of "0", and the state of switching unit SW2 is unrelated to the operation of control unit 12. At time t1, control unit 12 changes the value of current adjustment code IC from "00" to "01" and also changes the value of cancel code CN from "n0" to "n1". As a result, the oscillation frequency can fall within acceptable range FT, with little change in its value before and after time t1.

As described above, in RFIC 10 in accordance with Embodiment 1, when the value of the drive current for LC oscillator 50 is changed by changing the value of current adjustment code IC, the amount of a jump of the oscillation frequency before and after the change in the drive current can be suppressed by adjusting the value of cancel code CN. As a result, unlocking can be prevented, and even if unlocking occurs, a period of time taken until relocking is achieved can be shortened.

Embodiment 2

Figure 16:
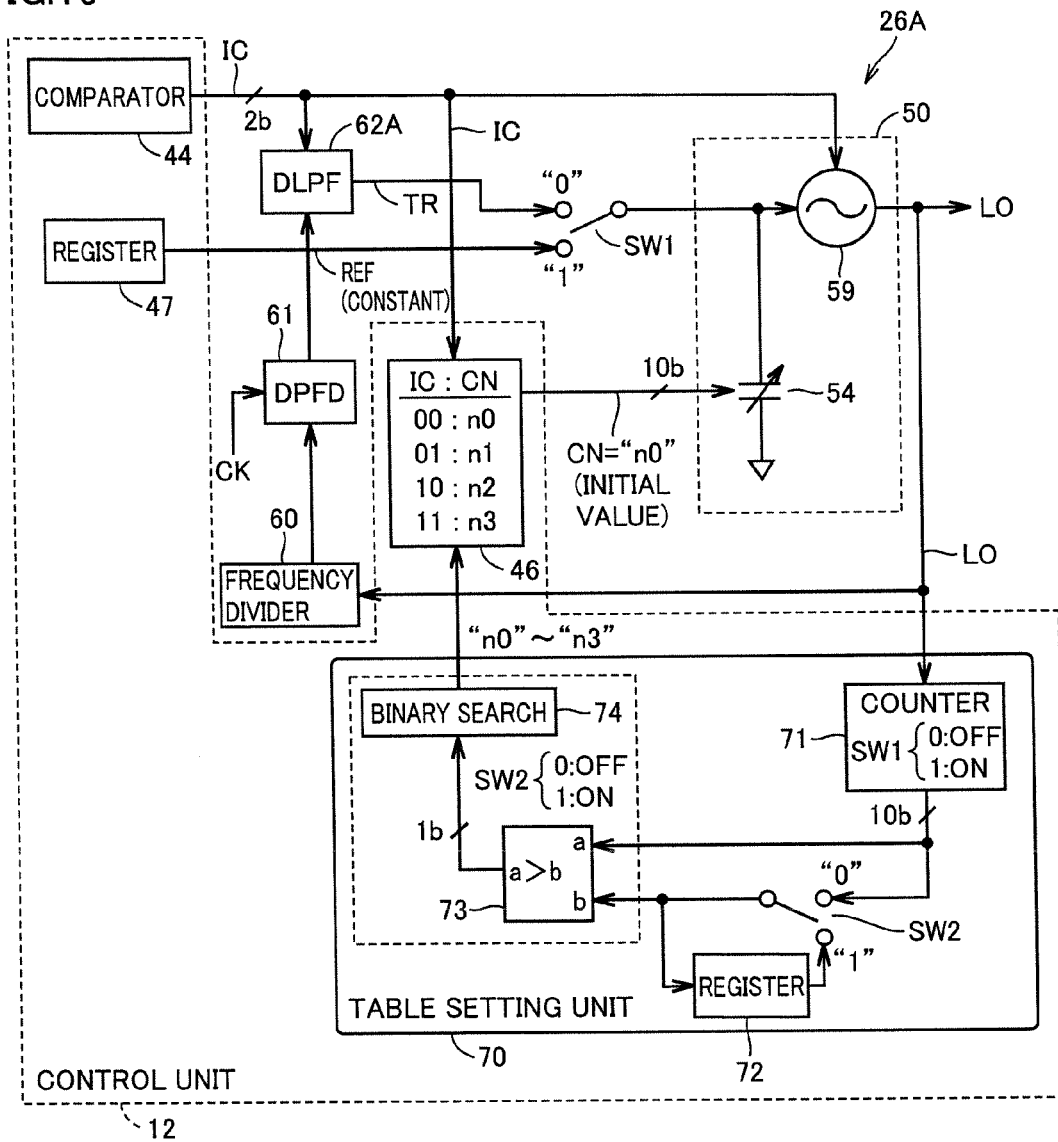
FIG. 16 is a block diagram showing configurations of a local oscillator 26A and control unit 12 in accordance with Embodiment 2 of the present invention.

FIG. 16 is a block diagram showing configurations of a local oscillator 26A and control unit 12 in accordance with Embodiment 2 of the present invention. In local oscillator 26A in FIG. 16, a digital low pass filter 62A has a configuration different from that of digital low pass filter 62 in Embodiment 1. Other than that, the configuration of local oscillator 26A and the configuration of control unit 12 are identical to those in Embodiment 1 described in FIGS. 2 and 10, and thus identical or corresponding parts will be designated by the same reference characters, and the description thereof will not be repeated.

Digital low pass filter 62A receives current adjustment code IC, and increases a passband width more than a normal bandwidth for a predetermined period of time after the value of current adjustment code IC is changed. As a result, a jump of the oscillation frequency of LC oscillator 50 can be suppressed when current adjustment code IC is changed, and in addition, a period of time taken until locking to a desired oscillation frequency is achieved (i.e., a lock-up time) can be shortened. Since a digital filter is used, a jump of the oscillation frequency which occurs when the passband width is restored to the normal bandwidth can also be suppressed.

Figure 17:
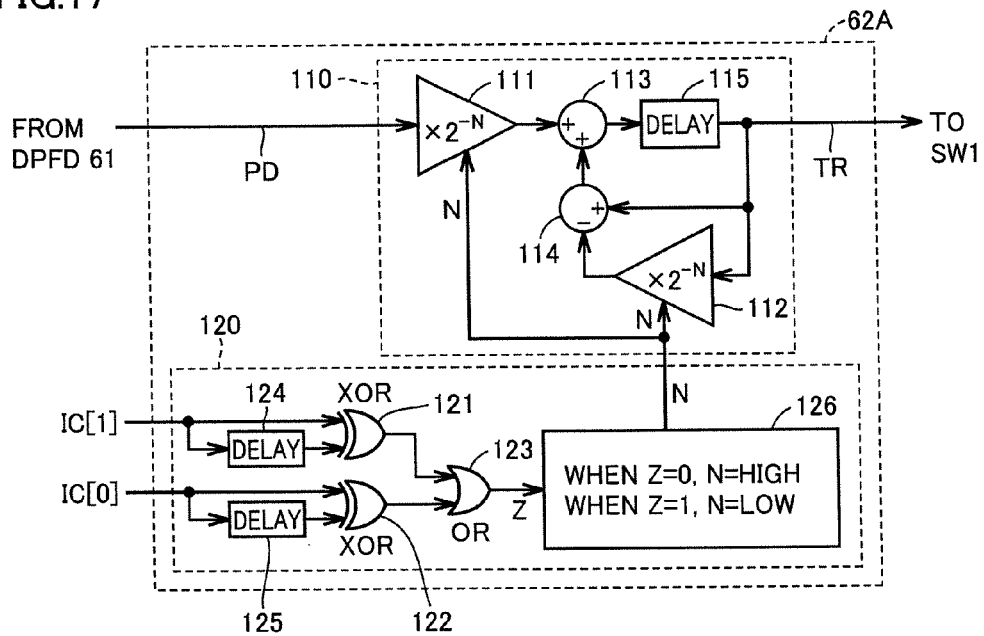
FIG. 17 is a view schematically showing an exemplary configuration of a digital low pass filter 62A in FIG. 16.

FIG. 17 is a view schematically showing an exemplary configuration of digital low pass filter 62A in FIG. 16. Referring to FIG. 17, digital low pass filter 62A includes an arithmetic unit 110, and a coefficient setting unit 120 setting a filter coefficient N.

Arithmetic unit 110 includes multipliers 111, 112, adders 113, 114, and a delay device 115. Multiplier 111 multiplies phase difference data PD output from digital phase comparator 61 in FIG. 16 by $2^{-N}$ (where N is the filter coefficient). Adder 113 adds an output of multiplier 111 to an output of adder 114, and outputs the resultant to delay device 115. An output of delay device 115 is supplied to switching unit SW1 in FIG. 16 as tracking code TR. Multiplier 112 multiplies the output of delay device 115 by $2^{-N}$ (where N is the filter coefficient). Adder 114 subtracts an output of multiplier 112 from the output of delay device 115.

Coefficient setting unit 120 includes exclusive logical addition (XOR) gates 121, 122, a logical addition (OR) gate 123, delay circuits 124, 125, and a determination circuit 126. When the current adjustment code is 2-bit data, a signal IC[1] corresponding to the higher-order bit is input to a first input terminal of XOR gate 121 and delay circuit 124. An output of delay circuit 124 is input to a second input terminal of XOR gate 121. A signal IC[0] corresponding to the lower-order bit of current adjustment code IC is input to a first input terminal of XOR gate 122 and delay circuit 125. An output of delay circuit 125 is input to a second input terminal of XOR gate 122. OR gate 123 outputs a logical sum of outputs of XOR gates 121, 122 to determination circuit 126.

Determination circuit 126 determines whether or not an output Z of OR gate 123 is "0" or "1". When the value of current adjustment code IC is changed, output Z of OR gate 123 is "1" for a delay time produced by delay circuits 124, 125. When output Z of OR gate 123 is "0", determination circuit 126 sets filter coefficient N to a relatively high value (N=HIGH), and when output Z of OR gate 123 is "1", determination circuit 126 sets filter coefficient N to a relatively low value (N=LOW). Therefore, after current adjustment code IC is changed, filter coefficient N has a relatively low value (N=LOW) for the delay time produced by delay circuits 124, 125, and thus digital low pass filter 62A has an increased passband width.

When the bit number of current adjustment code IC is other than two bits, it is possible to determine whether or not current adjustment code IC has been changed, by providing combinations each including a delay circuit and an XOR circuit in a number corresponding to the bit number, and obtaining a logical sum of outputs of the XOR circuits corresponding to the respective bits.

Figure 18:
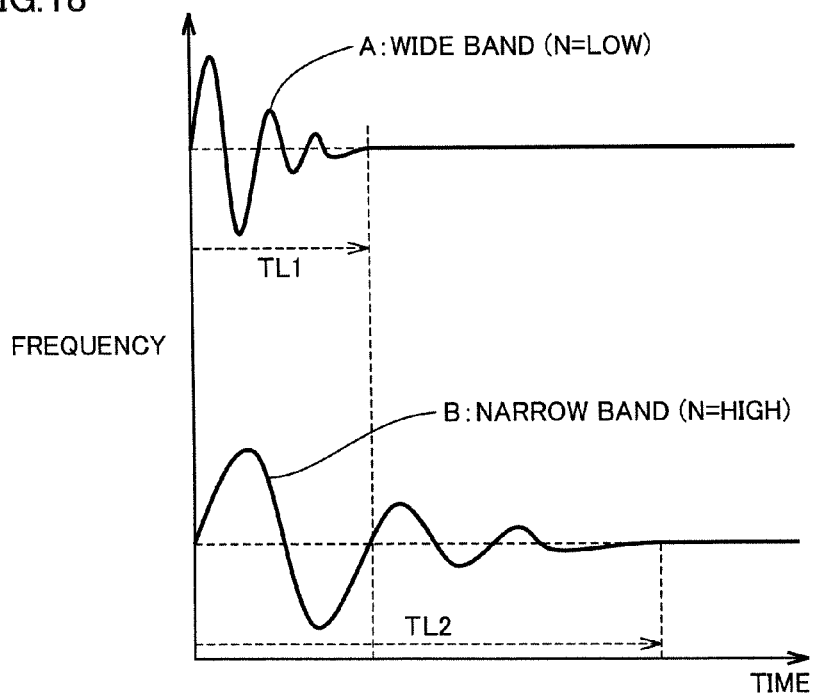
FIG. 18 is a view for illustrating the relation between a passband width of a digital low pass filter and a lock-up time.

FIG. 18 is a view for illustrating the relation between a passband width of a digital low pass filter and a lock-up time. In FIG. 18, graph A represents a temporal change in oscillation frequency in a case where a loop band is widened by setting filter coefficient N to be relatively low, and graph B represents a temporal change in oscillation frequency in a case where a loop band is narrowed by setting filter coefficient N to be relatively high. A lock-up time TL1 in case A with a relatively wide bandwidth is shorter than a lock-up time TL2 in case B with a relatively narrow bandwidth.

Figure 19:
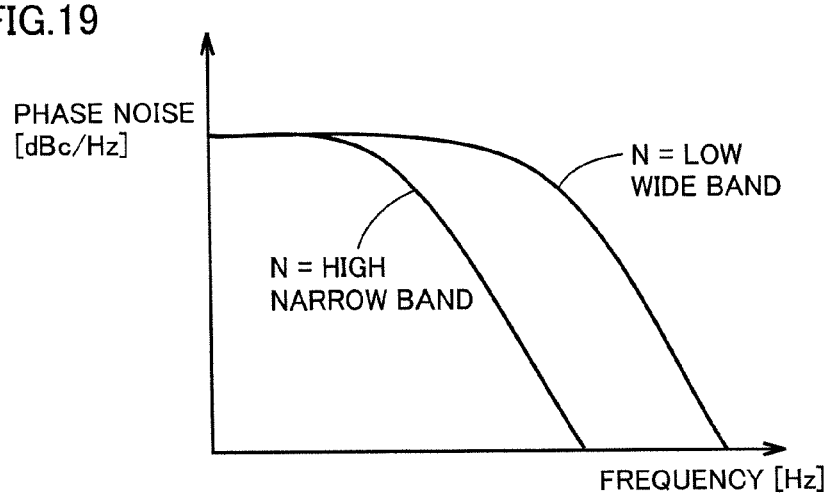
FIG. 19 is a view for illustrating phase noise characteristics of a PLL circuit.

FIG. 19 is a view for illustrating phase noise characteristics of a PLL circuit. In FIG. 19, the axis of abscissas represents frequency [Hz], and the axis of ordinates represents phase noise [dBc/Hz]. In a case where filter coefficient N is relatively low (N=LOW), the loop band is wider than that in a case where filter coefficient N is relatively high (N=HIGH), and thus phase noise characteristics are deteriorated.

Embodiment 3

Figure 20:
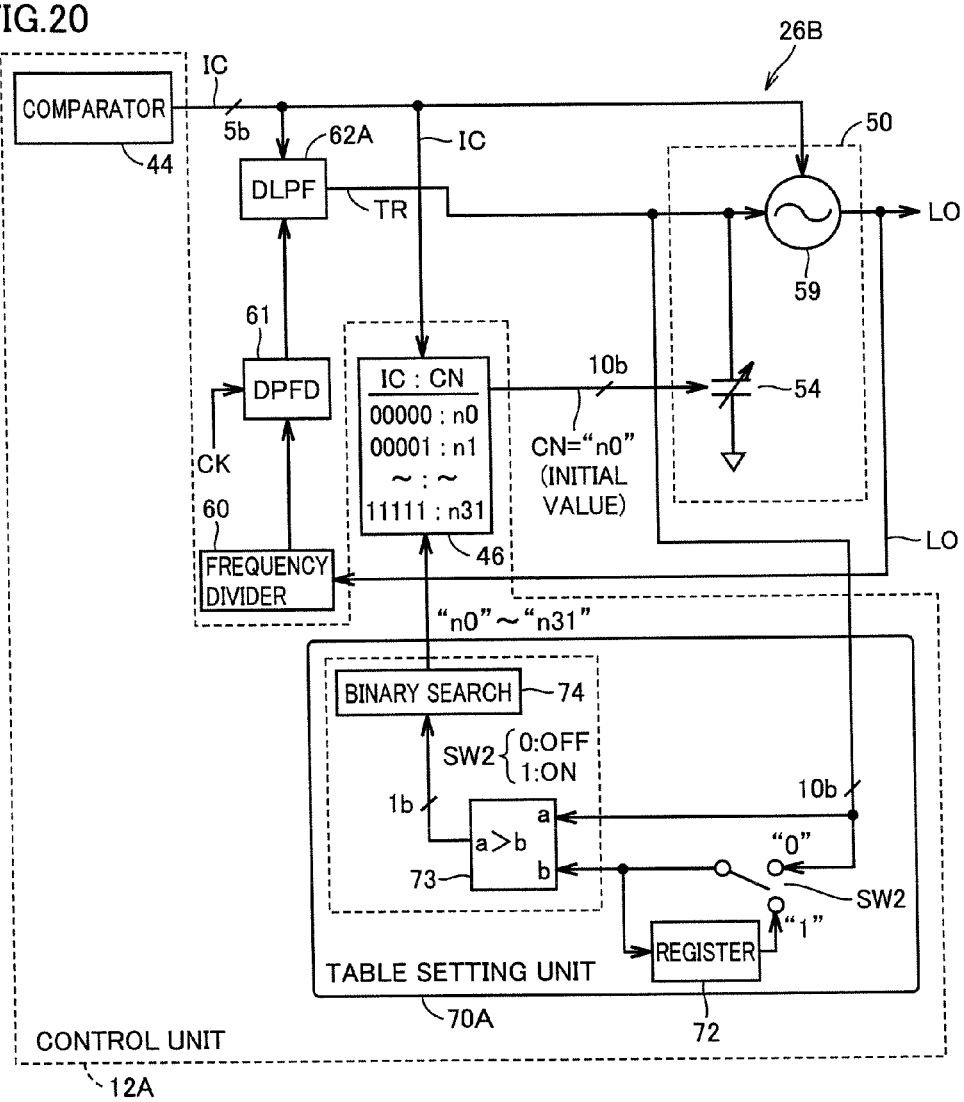
FIG. 20 is a block diagram showing configurations of a local oscillator 26B and a control unit 12A in accordance with Embodiment 3 of the present invention.

FIG. 20 is a block diagram showing configurations of a local oscillator 26B and a control unit 12A in accordance with Embodiment 3 of the present invention. Local oscillator 26B in FIG. 20 is different from local oscillator 26A in FIG. 16 in that it does not include switching unit SW1. In the case of Embodiment 3, tracking code TR is output from digital low pass filter 62A to LC oscillator 50 also during calibration.

Further, a table setting unit 70A in FIG. 20 is different from table setting unit 70 shown in FIGS. 10 and 16 in that it does not include frequency counter 71. In the case of FIG. 20, tracking code TR is input to comparator 73 and switching unit SW2 provided in table setting unit 70A. During calibration, in mode 1 (SW2="0"), input tracking code TR is held in register 72. In mode 2 (SW2="1"), input tracking code TR and tracking code TR held in register 72 are compared by comparator 73.

During calibration, control unit 12A changes the value of current adjustment code IC simultaneously with performing mode switching from mode 1 (SW2="0") to mode 2 (SW2="1"). Binary search logic 74 determines the value of cancel code CN to be supplied after the change of current adjustment code IC by a binary search method, such that values of tracking code TR before and after the change of the value of current adjustment code IC will be equal.

Specifically, binary search logic 74 sets the entire range from the minimum value to the maximum value of cancel code CN as an initial search range, and outputs a median value of the search range to table storage unit 46. The median value of the search range is output to capacitive unit 54 of LC oscillator 50 via table storage unit 46, and is used as cancel code CN. Based on the comparison result of comparator 73 for the value of cancel code CN, binary search logic 74 reduces the search range by half. The above process is repeated by the number of times equal to the bit number of cancel code CN, and thereby the value of cancel code CN is finally determined. Table storage unit 46 stores the determined value of cancel code CN so as to be associated with a change in the value of current adjustment code IC. For example, table storage unit 46 in FIG. 20 stores the value of cancel code CN to be output when 5-bit current adjustment code IC is changed from its initial value "00000", so as to be associated with the changed value of current adjustment code IC.

According to Embodiment 3, the value of cancel code CN to be output when the value of current adjustment code IC is changed can be determined with the oscillation frequency being controlled to a desired value by closed-loop control. Therefore, a jump of the oscillation frequency can be suppressed more accurately when compared with the cases of Embodiments 1, 2. Since tracking code TR is used instead of oscillation frequency to create a table, there is also an advantage that a frequency counter is not required. Other than that, the configurations in Embodiment 3 are identical to those in Embodiments 1, 2 shown in FIGS. 10 and 16, respectively, and thus identical or corresponding parts will be designated by the same reference characters, and the description thereof will not be repeated.

Although phase comparator 61 and low pass filter 62 are digital circuits in Embodiment 3, these can also be constituted by analog circuits. In this case, it is necessary to provide table setting unit 70A with an analog-to-digital converter which detects an analog control signal output from the low pass filter to the LC oscillator, receives the detected analog control signal, and converts it to a digital signal. An output of the analog-to-digital converter is input to comparator 73 and switching unit SW2.

Embodiment 4

In Embodiment 4, a variation of LC oscillator 50 described in FIG. 3 will be described.

Figure 21:
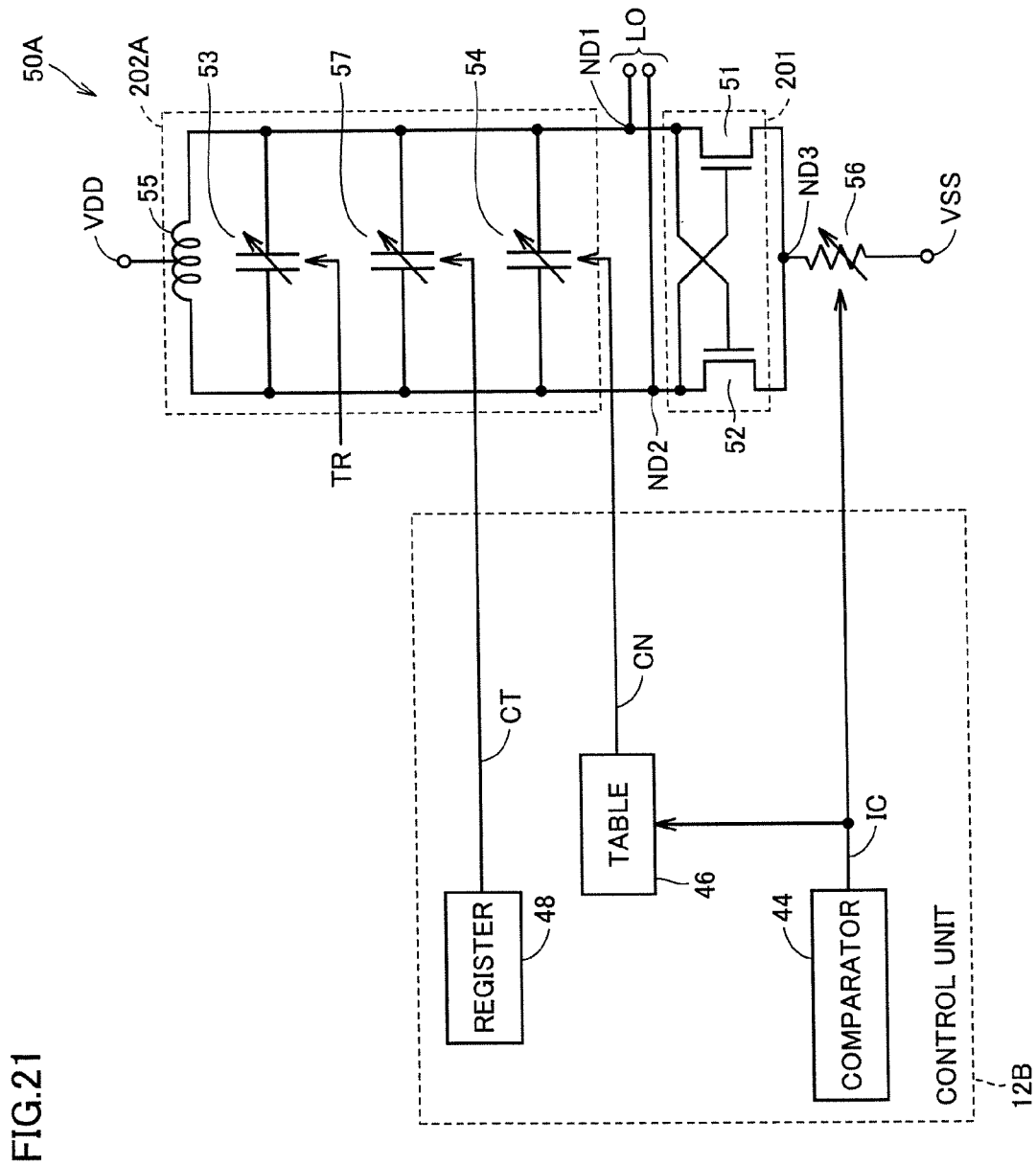
FIG. 21 is a view showing configurations of an LC oscillator 50A and a control unit 12B controlling the same, as a variation of Embodiment 1.

FIG. 21 is a view showing configurations of an LC oscillator 50A and a control unit 12B controlling the same, as a variation of Embodiment 1. A resonance circuit 202A in FIG. 21 is different from resonance circuit 202 in FIG. 3 in that it further includes a capacitive unit 57 connected between output nodes ND1 and ND2. Capacitive unit 57 has a capacitance value varying in accordance with the value of a rough adjustment code CT set in a register 48 within control unit 12B. An oscillation frequency of LC oscillator 50A can be roughly adjusted by changing the value of rough adjustment code CT.

Other than that, the configurations shown in FIG. 21 are identical to those in Embodiments 1, 2, and thus identical or corresponding parts will be designated by the same reference characters, and the description thereof will not be repeated. For example, when the value of current adjustment code IC is changed with rough adjustment code CT being constant, the value of cancel code CN is changed to keep a oscillation frequency of LC oscillator 50A constant in order to suppress a jump of the oscillation frequency, as in Embodiments 1, 2.

Figure 22:
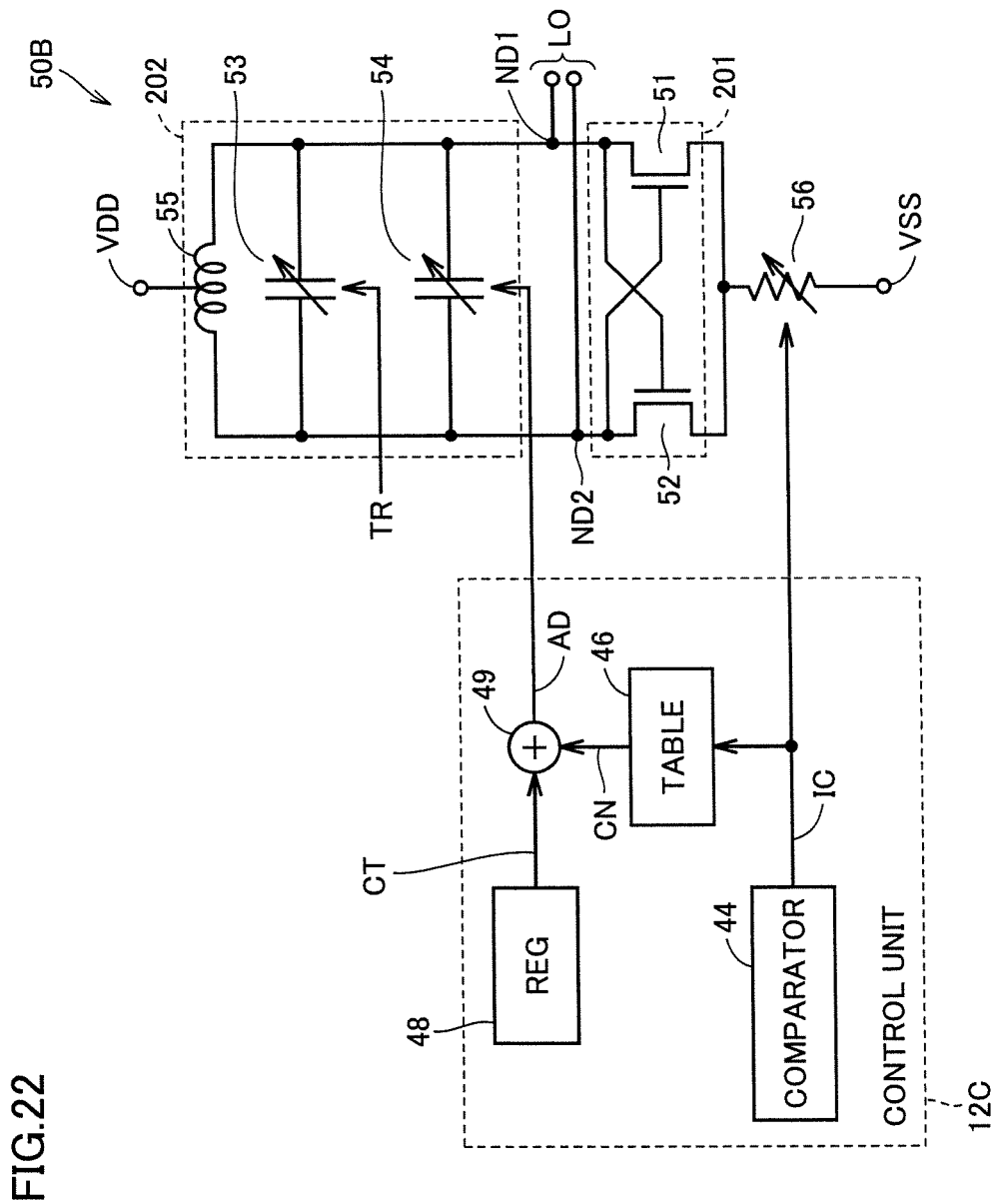
FIG. 22 is a view showing configurations of an LC oscillator 50B and a control unit 12C controlling the same, as a variation of Embodiment 2.

FIG. 22 is a view showing configurations of an LC oscillator 50B and a control unit 12C controlling the same, as a variation of Embodiment 2. LC oscillator 50B in FIG. 22 has a configuration identical to that of LC oscillator 50 described in FIG. 3. In addition to the configuration shown in FIG. 2, control unit 12C further includes register 48 for holding rough adjustment code CT, and an adder 49. Adder 49 adds rough adjustment code CT held in register 48 to cancel code CN output from table storage unit 46, and outputs an addition result AD to capacitive unit 54. Capacitive unit 54 has a capacitance value varying in accordance with addition result AD. Therefore, the oscillation frequency of LC oscillator 50B can be roughly adjusted by changing the value of rough adjustment code CT.

Other than that, the configurations shown in FIG. 22 are identical to those in Embodiments 1, 2, and thus identical or corresponding parts will be designated by the same reference characters, and the description thereof will not be repeated. For example, when the value of current adjustment code IC is changed with rough adjustment code CT being constant, cancel code CN is changed to keep an oscillation frequency of LC oscillator 50B constant in order to suppress a jump of the oscillation frequency, as in Embodiments 1, 2.

Embodiment 5

Unlocking of a PLL circuit may also occur by changing the amount of a drive current for a frequency divider, due to a load change in an LC oscillator. Further, also in a case where an amplifier in a transmission output stage is switched ON or OFF when switching of transmission and reception is performed in Time Division Duplex (TDD), unlocking of a PLL circuit may occur due to a voltage change in a power supply line. The method for suppressing a jump of the oscillation frequency described in Embodiments 1 to 4 can also be applied to the above cases.

Figure 23:
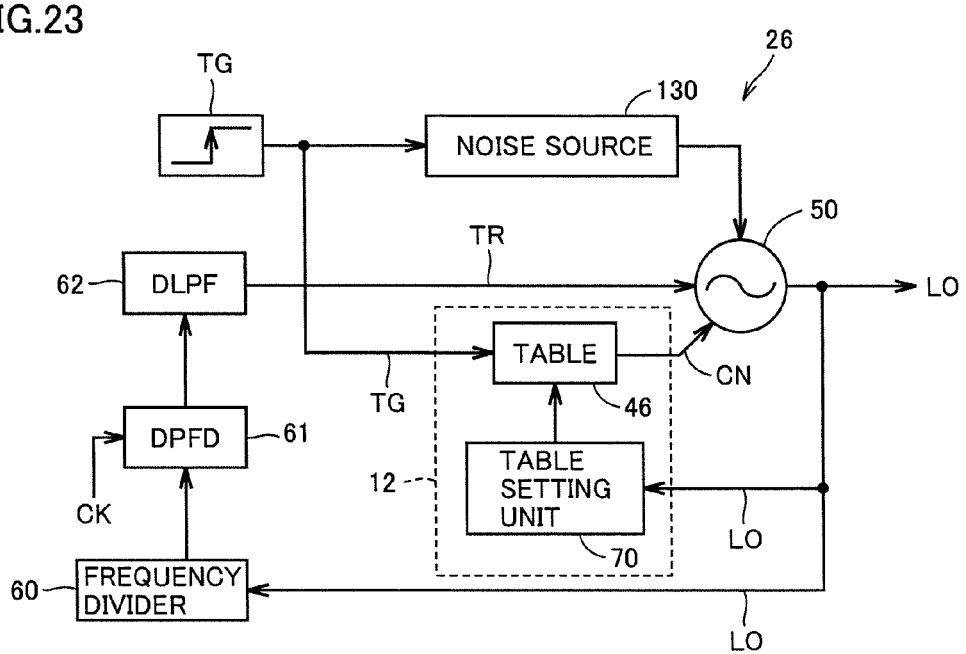
FIG. 23 is a view for illustrating a method for suppressing a jump of an oscillation frequency in a more common case.

FIG. 23 is a view for illustrating a method for suppressing a jump of an oscillation frequency in a more common case. As described in Embodiment 1, local oscillator (PLL circuit) 26 includes LC oscillator (controlled oscillator) 50, frequency divider 60, digital phase comparator 61, and digital low pass filter 62. LC oscillator 50 has the same configuration as that described in FIG. 3, and has an oscillation frequency varying in accordance with tracking code TR output from digital low pass filter 62.

Here, it is assumed that a jump occurs in the oscillation frequency of LC oscillator 50 (frequency of local oscillation signal LO) due to a change in the state of a noise source 130. Here, noise source 130 is, for example, an amplifier in a transmission output stage, and a change in the state of noise source 130 (for example, ON/OFF of the amplifier) occurs in accordance with a control signal (referred to as a trigger code TG) supplied to noise source 130. In order to suppress a jump of the oscillation frequency due to the change in the state of noise source 130, when the value of trigger code TG is changed, control unit 12 outputs cancel code CN corresponding to the change of the value, based on a preset table, to LC oscillator 50. Since the capacitance value of capacitive unit 54 provided in LC oscillator 50 varies in accordance with cancel code CN as described in FIG. 3, a jump of the oscillation frequency due to the change in the state of noise source 130 can be prevented from occurring. The table prestored in table storage unit 46 can be created by a method similar to that described in Embodiment 1.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: communications instrument; 2: baseband circuit; 4: power amplifier; 10: RFIC (semiconductor device); 11: interface unit; 12, 12A, 12B, 12C: control unit; 26, 26A, 26B, 82: local oscillator; 27, 83: phase shifter; 30: quadrature modulator; 46: table storage unit; 50, 50A, 50B: LC oscillator; 53, 53, 54, 54, 57: capacitive unit; 55: inductor; 56: current adjustment unit; 60: frequency divider; 61: digital phase comparator; 62, 62A: digital low pass filter; 62A: digital low pass filter; 70, 70A: table setting unit; 71: frequency counter; 74: binary search logic; 81: quadrature demodulator; 201: amplification unit; 202, 202A: resonance circuit; CK: clock signal; CN: cancel code; CT: rough adjustment code; FS: frequency setting code; GC: gain adjustment code; IC: current adjustment code; LO: local oscillation signal; REF: reference code; SW1, SW2: switching unit; TG: trigger code; TR: tracking code; VDD, VSS: power supply node.

The invention claimed is:

1. A semiconductor device comprising:
a controlled oscillator including:
  a resonance circuit including one or a plurality of inductors and a first capacitive unit having a variable capacitance value;
  an amplification unit connected to said resonance circuit, and outputting a local oscillation signal having an oscillation frequency corresponding to a resonance frequency of said resonance circuit; and
  a current adjustment unit adjusting a value of a drive current to be supplied to said amplification unit;
a control unit controlling the capacitance value of said first capacitive unit and said current adjustment unit;
a frequency divider outputting a frequency-divided signal of said local oscillation signal;
a phase comparator outputting a signal corresponding to a phase difference between an output of said frequency divider and a given reference signal;
a filter unit generating a feedback signal by removing a high-frequency component of an output of said phase comparator;
a modulator modulating said local oscillation signal using a given baseband signal and outputting said modulated local oscillation signal; and
an amplifier having an adjustable gain amplifying an output of said modulator, wherein:
said resonance circuit further includes a second capacitive unit having a capacitance value varying in accordance with a value of said feedback signal,
when said control unit instructs said current adjustment unit to change the value of the drive current to be supplied to said amplification unit, said control unit changes the capacitance value of said first capacitive unit to keep said oscillation frequency constant, and
said control unit instructs said current adjustment unit to change the value of the drive current to be supplied to said amplification unit in accordance with the gain of said amplifier.

2. A semiconductor device comprising:
a controlled oscillator including:
  a resonance circuit including one or a plurality of inductors and a first capacitive unit having a variable capacitance value;
  an amplification unit connected to said resonance circuit, and outputting a local oscillation signal having an oscillation frequency corresponding to a resonance frequency of said resonance circuit; and
  a current adjustment unit adjusting a value of a drive current to be supplied to said amplification unit;
a control unit controlling the capacitance value of said first capacitive unit and said current adjustment unit;
a frequency divider outputting a frequency-divided signal of said local oscillation signal;
a phase comparator outputting a signal corresponding to a phase difference between an output of said frequency divider and a given reference signal; and
a filter unit generating a feedback signal by removing a high-frequency component of an output of said phase comparator, wherein:
said resonance circuit further includes a second capacitive unit having a capacitance value varying in accordance with a value of said feedback signal, and
when said control unit instructs said current adjustment unit to change the value of the drive current to be supplied to said amplification unit, said control unit changes the capacitance value of said first capacitive unit to keep said oscillation frequency constant,
the semiconductor device further comprising a switching unit provided in a path of said feedback signal between said filter unit and said controlled oscillator, and supplying one of said feedback signal and a predetermined constant signal to said second capacitive unit of said controlled oscillator, wherein:
the capacitance value of said first capacitive unit varies in accordance with a value of a first control signal generated by said control unit,
said current adjustment unit adjusts the value of the drive current to be supplied to said amplification unit in accordance with a value of a second control signal generated by said control unit,
during calibration, said control unit changes the value of said second control signal with said constant signal being supplied to said second capacitive unit by operating said switching unit, said control unit determines the value of said first control signal to be supplied after changing the value of said second control signal, such that frequencies of said local oscillation signal detected before and after changing the value of said second control signal will be equal, and said control unit stores the determined value of said first control signal as a table so as to be associated with a change in the value of said second control signal, and
when said control unit changes the value of said second control signal during normal operation in which said feedback signal is supplied to said controlled oscillator via said switching unit, said control unit determines the value of said first control signal to be supplied after changing the value of said second control signal, based on said table.

3. A semiconductor device comprising:
a controlled oscillator including:
   a resonance circuit including one or a plurality of inductors and a first capacitive unit having a variable capacitance value;
   an amplification unit connected to said resonance circuit, and outputting a local oscillation signal having an oscillation frequency corresponding to a resonance frequency of said resonance circuit; and
   a current adjustment unit adjusting a value of a drive current to be supplied to said amplification unit;
a control unit controlling the capacitance value of said first capacitive unit and said current adjustment unit;
a frequency divider outputting a frequency-divided signal of said local oscillation signal;
a phase comparator outputting a signal corresponding to a phase difference between an output of said frequency divider and a given reference signal; and
a filter unit generating a feedback signal by removing a high-frequency component of an output of said phase comparator, wherein:
said resonance circuit further includes a second capacitive unit having a capacitance value varying in accordance with a value of said feedback signal,
when said control unit instructs said current adjustment unit to change the value of the drive current to be supplied to said amplification unit, said control unit changes the capacitance value of said first capacitive unit to keep said oscillation frequency constant,
the capacitance value of said first capacitive unit varies in accordance with a value of a first control signal generated by said control unit,
said current adjustment unit adjusts the value of the drive current to be supplied to said amplification unit in accordance with a value of a second control signal generated by said control unit,
during calibration, said control unit changes the value of said second control signal, said control unit determines the value of said first control signal to be supplied after changing the value of said second control signal, such that values of said feedback signal detected before and after changing the value of said second control will be equal, and said control unit stores the determined value of said first control signal as a table so as to be associated with a change in the value of said second control signal, and
when said control unit changes the value of said second control signal during normal operation, said control unit determines the value of said first control signal to be supplied after changing the value of said second control signal, based on said table.

4. A semiconductor device comprising:
a controlled oscillator including:
   a resonance circuit including one or a plurality of inductors and a first capacitive unit having a variable capacitance value;
   an amplification unit connected to said resonance circuit, and outputting a local oscillation signal having an oscillation frequency corresponding to a resonance frequency of said resonance circuit; and
   a current adjustment unit adjusting a value of a drive current to be supplied to said amplification unit;
a control unit controlling the capacitance value of said first capacitive unit and said current adjustment unit;
a frequency divider outputting a frequency-divided signal of said local oscillation signal;
a phase comparator outputting a signal corresponding to a phase difference between an output of said frequency divider and a given reference signal; and
a filter unit generating a feedback signal by removing a high-frequency component of an output of said phase comparator, wherein:
said resonance circuit further includes a second capacitive unit having a capacitance value varying in accordance with a value of said feedback signal,
when said control unit instructs said current adjustment unit to change the value of the drive current to be supplied to said amplification unit, said control unit changes the capacitance value of said first capacitive unit to keep said oscillation frequency constant,
said filter unit is constituted by a digital circuit, and can change a passband width in accordance with an instruction from said control unit, and
when said control unit instructs said current adjustment unit to change the value of the drive current to be supplied to said amplification unit, said control unit increases the passband width of said filter unit more than a normal bandwidth.

5. A semiconductor device comprising:
a controlled oscillator including:
   a resonance circuit including one or a plurality of inductors and a first capacitive unit having a variable capacitance value;
   an amplification unit connected to said resonance circuit, and outputting a local oscillation signal having an oscillation frequency corresponding to a resonance frequency of said resonance circuit; and
   a current adjustment unit adjusting a value of a drive current to be supplied to said amplification unit;
a control unit controlling the capacitance value of said first capacitive unit and said current adjustment unit
a frequency divider outputting a frequency-divided signal of said local oscillation signal;
a phase comparator outputting a signal corresponding to a phase difference between an output of said frequency divider and a given reference signal; and
a filter unit generating a feedback signal by removing a high-frequency component of an output of said phase comparator, wherein:
when said control unit instructs said current adjustment unit to change the value of the drive current to be supplied to said amplification unit said control unit also changes the capacitance value of said first capacitive unit,
said resonance circuit further includes a second capacitive unit having a capacitance value varying in accordance with a value of said feedback signal,
said control unit generates a first control signal and a second control signal,
the capacitance value of said first capacitive unit varies in accordance with a value of a signal obtained by adding said first control signal and said second control signal, and
when said control unit instructs said current adjustment unit to change the value of the drive current to be supplied to said amplification unit with said second control signal being kept constant, said control unit changes a value of said first control signal to keep said oscillation frequency constant.

* * * * *